(12) United States Patent
Zhang et al.

(10) Patent No.: US 11,830,763 B2
(45) Date of Patent: Nov. 28, 2023

(54) METHODS OF MANUFACTURING THIN FILM TRANSISTOR, BIOMETRIC DEVICE, AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Shan Zhang, Beijing (CN); Lianjie Qu, Beijing (CN); Yonglian Qi, Beijing (CN); Hebin Zhao, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 263 days.

(21) Appl. No.: 17/278,855

(22) PCT Filed: Jul. 24, 2020

(86) PCT No.: PCT/CN2020/104464
§ 371 (c)(1),
(2) Date: Mar. 23, 2021

(87) PCT Pub. No.: WO2021/018037
PCT Pub. Date: Feb. 4, 2021

(65) Prior Publication Data
US 2022/0037198 A1 Feb. 3, 2022

(30) Foreign Application Priority Data
Jul. 26, 2019 (CN) .......................... 201910684062.1

(51) Int. Cl.
*H01L 21/765* (2006.01)
*H01L 21/762* (2006.01)
(Continued)

(52) U.S. Cl.
CPC .... *H01L 21/76254* (2013.01); *H01L 21/6835* (2013.01); *H01L 27/127* (2013.01);
(Continued)

(58) Field of Classification Search
CPC .......... H01L 21/76254; H01L 21/6835; H01L 27/127; H01L 29/66772; H01L 29/78654;
(Continued)

(56) References Cited

U.S. PATENT DOCUMENTS 6,146,979 A * 11/2000 Henley ............... H01L 21/2658
438/455
6,762,470 B2 * 7/2004 Siegel ................ G06V 40/1329
257/414

(Continued)

FOREIGN PATENT DOCUMENTS

| CN | 1082321695 | 6/2018 |
|----|------------|--------|
| CN | 109786392  | 5/2019 |

(Continued)

OTHER PUBLICATIONS

PCT International Search Report (w/ English translation) for corresponding PCT Application No. PCT/CN2020/104464, dated Oct. 10, 2020, 6 pages.

(Continued)

*Primary Examiner* — Vu A Vu
(74) *Attorney, Agent, or Firm* — Dority & Manning, P.A.

(57) ABSTRACT

A method of manufacturing thin film transistor(s) includes: providing a monocrystalline silicon wafer, the monocrystalline silicon wafer including a first surface and a second surface that are opposite to each other; forming a bubble layer between the first surface and the second surface of the monocrystalline silicon wafer, the bubble layer dividing the monocrystalline silicon wafer into two portions arranged side by side in a direction perpendicular to the second (Continued)

surface, and a portion of the monocrystalline silicon wafer that is located between the bubble layer and the second surface being a monocrystalline silicon film having a target thickness; providing a substrate, and transferring the monocrystalline silicon film onto the substrate by breaking the monocrystalline silicon wafer at the bubble layer; and patterning the monocrystalline silicon film transferred to the substrate to form active layer(s) of the thin film transistor(s).

17 Claims, 16 Drawing Sheets

(51) Int. Cl.
*H01L 21/683* (2006.01)
*H01L 27/12* (2006.01)
*H01L 29/66* (2006.01)
*H01L 29/786* (2006.01)
*G06V 40/13* (2022.01)

(52) U.S. Cl.
CPC .. *H01L 29/66772* (2013.01); *H01L 29/78654* (2013.01); *G06V 40/1318* (2022.01); *H01L 2221/68368* (2013.01)

(58) Field of Classification Search
CPC ....... H01L 2221/68368; H01L 27/1203; H01L 27/1266; H01L 2221/6835; H01L 2221/68381; H01L 21/02532; H01L 21/02598; H01L 27/1214; H01L 29/66742; H01L 29/6675; G06V 40/1318
USPC ......................................... 438/162
See application file for complete search history.

(56) References Cited

U.S. PATENT DOCUMENTS

| 7,508,034 | B2* | 3/2009 | Takafuji | H01L 29/78603 257/66 |
|---|---|---|---|---|
| 7,763,502 | B2* | 7/2010 | Kakehata | H01L 21/76254 438/455 |
| 7,839,001 | B2* | 11/2010 | Boussagol | H01L 21/2007 438/455 |
| 8,101,999 | B2* | 1/2012 | Takizawa | H01L 21/2658 438/70 |
| 8,143,140 | B2* | 3/2012 | Kasai | H01L 21/76251 257/E21.568 |
| 8,222,117 | B2* | 7/2012 | Yamazaki | H01L 21/76254 257/507 |
| 8,476,146 | B2* | 7/2013 | Chen | H01L 21/76254 438/455 |
| 8,637,383 | B2* | 1/2014 | Werkhoven | H01L 29/2003 438/458 |
| 8,877,607 | B2* | 11/2014 | Koezuka | H01L 21/76254 257/E21.568 |
| 9,136,141 | B2* | 9/2015 | Koezuka | H01L 21/76254 |
| 9,793,154 | B2* | 10/2017 | Aga | H01L 21/022 |
| 2006/0040469 | A1 | 2/2006 | Aga et al. | |
| 2008/0280416 | A1 | 11/2008 | Bedell et al. | |
| 2010/0096720 | A1 | 4/2010 | Ohnuma et al. | |
| 2010/0291752 | A1 | 11/2010 | Okuno | |
| 2013/0092320 | A1 | 4/2013 | Argoud et al. | |
| 2018/0175283 | A1 | 6/2018 | Akiyama et al. | |

FOREIGN PATENT DOCUMENTS

| CN | 110349843 | 10/2019 |
|---|---|---|
| JP | 5286684 | 9/2013 |
| WO | WO2011131847 | 10/2011 |

OTHER PUBLICATIONS

Chinese First Office Action (w/ English translation) for corresponding CN Application No. 201910684062.1, 22 pages.
Chinese Second Office Action (w/ English translation) for corresponding CN Application No. 201910684062.1, 17 pages.

\* cited by examiner

METHODS OF MANUFACTURING THIN FILM TRANSISTOR, BIOMETRIC DEVICE, AND DISPLAY APPARATUS

CROSS-REFERENCE TO RELATED APPLICATIONS

This application is a national phase entry under 35 USC 371 of International Patent Application No. PCT/CN2020/104464, filed on Jul. 24, 2020, which claims priority to Chinese Patent Application No. 201910684062.1, filed on Jul. 26, 2019, which are incorporated herein by reference in their entirety.

TECHNICAL FIELD

The present disclosure relates to the field of display technologies, and in particular, to a method of manufacturing at least one thin film transistor, a method of manufacturing a biometric device, a method of manufacturing an array substrate and methods of manufacturing display apparatuses.

BACKGROUND

Depending on a material for forming an active layer in a thin film transistor (TFT), TFTs may be divided into amorphous silicon TFTs (a-Si:H TFTs), low temperature polycrystalline TFTs (LTPS TFTs), high temperature polycrystalline TFTs (HTPS TFTs), metal oxide TFTs, monocrystalline silicon TFTs, and so forth. Among them, monocrystalline silicon TFTs have a higher carrier mobility and better conductivity. However, at present, it is difficult to manufacture monocrystalline silicon TFTs on a base substrate of a non-monocrystalline silicon material, such as glass.

SUMMARY

In one aspect, a method of manufacturing thin film transistor(s) is provided. The method includes: providing a monocrystalline silicon wafer including a first surface and a second surface that are opposite to each other; forming a bubble layer between the first surface and the second surface of the monocrystalline silicon wafer, the bubble layer dividing the monocrystalline silicon wafer into two portions arranged side by side in a direction perpendicular to the second surface, and a portion of the monocrystalline silicon wafer that is located between the bubble layer and the second surface being a monocrystalline silicon film having a target thickness; providing a substrate, and transferring the monocrystalline silicon film onto the substrate by breaking the monocrystalline silicon wafer at the bubble layer; and patterning the monocrystalline silicon film transferred to the substrate to form active layer(s) of the thin film transistor(s).

In some embodiments, providing the substrate, and transferring the monocrystalline silicon film onto the substrate by breaking the monocrystalline silicon wafer at the bubble layer, include: providing a temporary support base, and temporarily bonding the second surface of the monocrystalline silicon wafer and a surface of the temporary support base together; performing heat treatment on the monocrystalline silicon wafer and the temporary support base that are temporarily bonded together to break the monocrystalline silicon wafer at the bubble layer, so that a portion of the monocrystalline silicon wafer that is located between the bubble layer and the first surface is stripped off, and the monocrystalline silicon film remains on the surface of the temporary support base; providing the substrate, and bonding a surface, away from the temporary support base, of the monocrystalline silicon film and a surface of the substrate together; and debonding the monocrystalline silicon film and the temporary support base to remove the temporary support base.

In some embodiments, before bonding the surface, away from the temporary support base, of the monocrystalline silicon film and the surface of the substrate together, the method further includes: polishing the surface, away from the temporary support base, of the monocrystalline silicon film.

In some embodiments, before bonding the surface, away from the temporary support base, of the monocrystalline silicon film and the surface of the substrate together, the method further includes: forming a first bonding adhesive layer on the surface, to be bonded with the monocrystalline silicon film, of the provided substrate; and/or forming a first bonding adhesive layer on the surface, away from the temporary support base, of the monocrystalline silicon film.

In some embodiments, providing the substrate, and transferring the monocrystalline silicon film onto the substrate by breaking the monocrystalline silicon wafer at the bubble layer, include: providing the substrate, and bonding the second surface of the monocrystalline silicon wafer and a surface of the substrate together; performing heat treatment on the monocrystalline silicon wafer and the substrate that are bonded together to break the monocrystalline silicon wafer at the bubble layer, so that a portion of the monocrystalline silicon wafer that is located between the bubble layer and the first surface is stripped off, and the monocrystalline silicon film remains on the surface of the substrate.

In some embodiments, the method further includes: polishing a surface, away from the substrate, of the monocrystalline silicon film remaining on the surface of the substrate.

In some embodiments, before bonding the second surface of the monocrystalline silicon wafer and the surface of the substrate together, the method further includes: forming a second bonding adhesive layer on the surface, to be bonded with the monocrystalline silicon wafer, of the provided substrate; and/or forming a second bonding adhesive layer on the second surface of the monocrystalline silicon wafer.

In some embodiments, before temporarily bonding the second surface of the monocrystalline silicon wafer and the surface of the temporary support base together, or before bonding the second surface of the monocrystalline silicon wafer and the surface of the substrate together, the method further includes: polishing the second surface of the monocrystalline silicon wafer.

In some embodiments, forming the bubble layer between the first surface and the second surface of the monocrystalline silicon wafer, includes: implanting gas ions into the monocrystalline silicon wafer from the first surface or the second surface of the monocrystalline silicon wafer by using an ion implantation process. A depth of ion implantation is controlled to form the bubble layer at a pre-determined position between the first surface and the second surface of the monocrystalline silicon wafer. A distance between the pre-determined position and the second surface is the target thickness.

In some embodiments, before the step of providing the substrate, the method further includes a step of manufacturing the substrate, including: forming gate(s) of the thin film transistor(s) on a side of a base substrate; and forming a gate insulating layer on a surface, away from the base substrate, of the gate(s) to obtain the substrate. After patterning the monocrystalline silicon film transferred to the substrate to form the active layer(s) of the thin film transistor(s), the method further includes: forming source(s) and drain(s) of the thin film transistor(s) on a side, away from the base substrate, of the active layer(s).

In some embodiments, before the step of providing the substrate, the method further includes a step of manufacturing the substrate, including: forming a barrier layer on a side of a base substrate to obtain the substrate. After patterning the monocrystalline silicon film transferred to the substrate to form the active layer(s) of the thin film transistor(s), the method further includes: sequentially forming a gate insulating layer, gate(s) of the thin film transistor(s), an interlayer dielectric layer, and both source(s) and drain(s) of the thin film transistor(s) on a side, away from the base substrate, of the active layer(s).

In some embodiments, the base substrate is a glass substrate or a flexible substrate.

In some embodiments, a thickness of the active layer is 1 μm to 10 μm.

In another aspect, a method of manufacturing an array substrate is provided. The method includes forming a structure including a base substrate and a plurality of thin film transistors on the base substrate as described in some of the above embodiments, the thin film transistor(s) including the plurality of thin film transistors.

In yet another aspect, a method of manufacturing a display apparatus is provided. The method includes forming the array substrate as described in some of the above embodiments.

In yet another aspect, a method of manufacturing a biometric device is provided. The biometric device includes a base substrate and at least one biometric sensor on the base substrate, and each biometric identification sensor includes at least one thin film transistor. The method includes forming a structure including the base substrate and at least one thin film transistor included in the at least one biometric sensor as described in some of the above embodiments.

In yet another aspect, a method of manufacturing a display apparatus is provided. The display apparatus includes at least one biometric device. The method includes forming a biometric device as described in some of the above embodiments.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
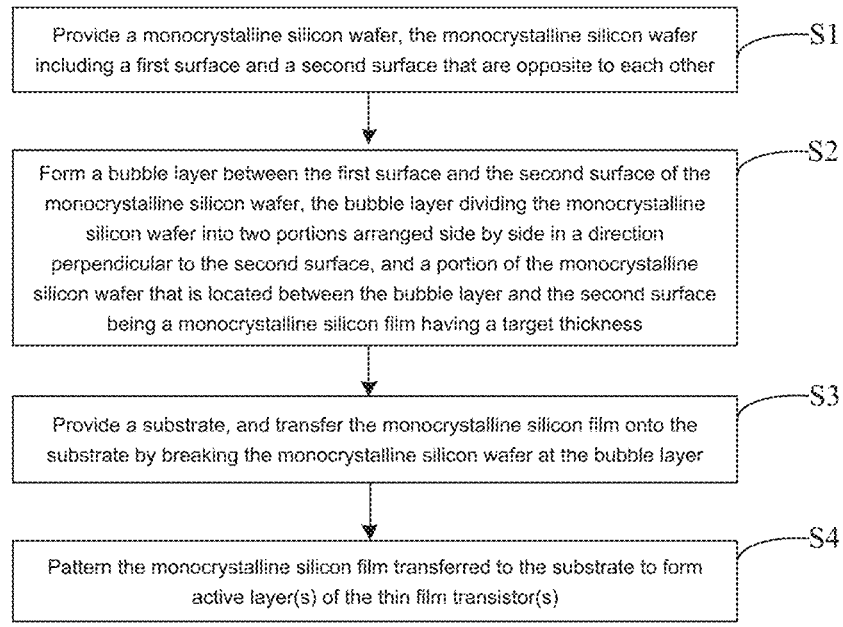
FIG. 1 is a flowchart of a method of manufacturing thin film transistor(s), in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, term "comprise" and other forms thereof such as the third-person singular form "comprises" and the present participle form "comprising" throughout the description and the claims are construed as an open and inclusive meaning, i.e., "including, but not limited to". In the description, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any or more embodiments or examples in any suitable manner.

Terms such as "first" and "second" are used for descriptive purposes only, and are not to be construed as indicating or implying the relative importance or implicitly indicating the number of indicated technical features below. Thus, features defined with "first" and "second" may explicitly or implicitly include one or more of the features. In the description of the embodiments of the present disclosure, the term "a/the plurality of" means two or more unless otherwise specified.

The expression "at least one of A, B and C" has a same meaning as the expression "at least one of A, B or C", and both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that", or "in a case where [the stated condition or event] is detected" or "in response to detecting [the stated condition or event]", depending on the context.

In addition, the use of the expression "based on" is meant to be open and inclusive, since a process, step, calculation or other action that is "based on" one or more of the stated conditions or values may, in practice, be based on additional conditions or values other than those stated.

Exemplary embodiments are described herein with reference to sectional views and/or plan views as idealized exemplary drawings. In the accompanying drawings, thicknesses of layers and sizes of regions are enlarged for clarity. Variations in shape relative to the accompanying drawings due to, for example, manufacturing techniques and/or tolerances may be envisaged. Therefore, the exemplary embodiments should not be interpreted as being limited to the shapes of regions shown herein, but as including deviations in the shapes due to, for example, manufacturing. For example, an etched region shown in a rectangular shape generally has a curved feature. Therefore, areas shown in the accompanying drawings are schematic in nature, and their shapes are not intended to show actual shapes of the areas in a device and are not intended to limit the scope of the exemplary embodiments.

Thin film transistors are important components in a display apparatus. At present, active layers of thin film transistors are mainly made of low temperature polycrystalline (LTPS), metal oxide, monocrystalline silicon, or the like. Among them, LTPS has a carrier mobility of up to approximately 100 $cm^2/V \cdot s$, metal oxide has a carrier mobility of 10 $cm^2/V \cdot s$ to 50 $cm^2/V \cdot s$, and monocrystalline silicon has a carrier mobility of over 1,000 $cm^2/V \cdot s$. It can be seen that, monocrystalline silicon has an extremely high carrier mobility, and it may be possible to significantly improve a performance of the thin film transistors by using a monocrystalline silicon material to make the active layers.

In the related art, base substrates of thin film transistors in mobile phones, computers and other display products are generally glass substrates. However, it is still difficult to fabricate thin film transistors on a base substrate made of a non-monocrystalline silicon material, such as glass. At present, a monocrystalline silicon film is generally made by an epitaxial thin film growth technology, and the base substrate adopted is usually of a monocrystalline silicon material. Since manufacturing of the monocrystalline silicon film imposes high requirements on base substrate selection, temperature control, film formation rate and vacuum degree of film formation, and requires strict process conditions, it is difficult to manufacture the monocrystalline silicon film. In addition, in a case where a monocrystalline silicon film is fabricated on a base substrate of a non-monocrystalline silicon material such as glass, since it is difficult to meet the strict process conditions (for example, the base substrate may be of a wrong type, the temperature may not be well controlled, etc.), it is difficult to manufacture the monocrystalline silicon film on the base substrate of a non-monocrystalline silicon material such as glass. All in all, it is very difficult to manufacture thin film transistors with active layers of a monocrystalline silicon material on a base substrate of a non-monocrystalline silicon material such as glass.

Some embodiments of the present disclosure provide a method of manufacturing thin film transistor(s). As shown in FIG. 1, the manufacturing method includes S1 to S4.

Figure 4:
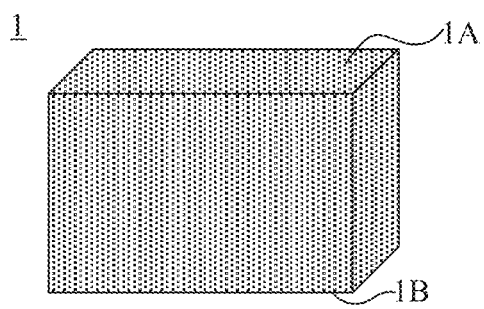
FIGS. 4 and 5 are diagrams showing steps in S1 and S2 of the method of manufacturing the thin film transistor(s), in accordance with some embodiments of the present disclosure.

In S1, as shown in FIG. 4, a monocrystalline silicon wafer 1 is provided. The monocrystalline silicon wafer 1 includes a first surface 1A and a second surface 1B that are opposite to each other.

Figure 5:
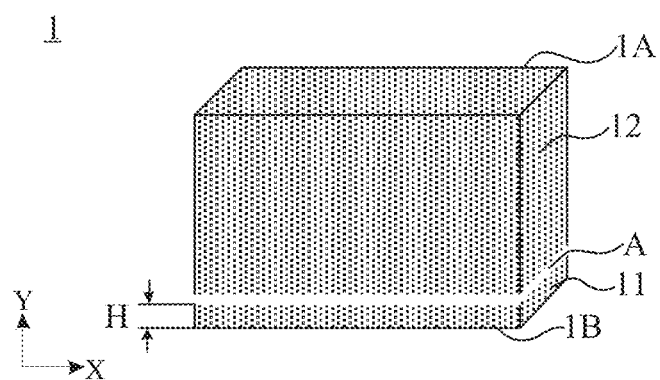

In S2, as shown in FIG. 5, a bubble layer A is formed between the first surface 1A and the second surface 1B of the monocrystalline silicon wafer 1. The bubble layer A divides the monocrystalline silicon wafer 1 into two portions 11 and 12 arranged side by side in a direction Y perpendicular to the second surface 1B, and a portion of the monocrystalline silicon wafer that is located between the bubble layer A and the second surface 1B is a monocrystalline silicon film 11 having a target thickness H.

In some embodiments, the bubble layer A formed between the first surface 1A and the second surface 1B of the monocrystalline silicon wafer 1 is composed of a plurality of cavities, and the plurality of cavities are filled with gas. The bubble layer A divides the monocrystalline silicon wafer 1 into two portions: one portion is a monocrystalline silicon body 12 between the bubble layer A and the first surface 1A, and the other portion is the monocrystalline silicon film 11 between the bubble layer A and the second surface 1B.

The monocrystalline silicon film 11 having the target thickness H may be used to form active layer(s) of the thin film transistor(s) to be manufactured. That is, the target thickness H is equal to or approximately equal to a desired thickness of the active layer of the thin film transistor to be manufactured.

For example, the target thickness H is 1 µm to 10 µm. For example, the target thickness H may be 1 µm, 3 µm, 5 µm, 7 µm, or 10 µm. In this case, the thickness of the active layer of the thin film transistor may be 1 µm to 10 µm, such as, 1 µm, 3 µm, 5 µm, 7 µm or 10 µm.

In some embodiments, the monocrystalline silicon wafer 1 needs to have a certain thickness. In the subsequent step of manufacturing the thin film transistor(s), by using the bubble layer A to break the monocrystalline silicon wafer, the monocrystalline silicon body 12 will be separated from the monocrystalline silicon film 11, so as to obtain the monocrystalline silicon film 11. On this basis, the monocrystalline silicon wafer 1 needs to have a certain thickness, so that the monocrystalline silicon body 12 to be stripped off has a sufficient thickness, and it can be ensured that the monocrystalline silicon body 12 has sufficient mechanical strength and can be stripped off smoothly. Therefore, the monocrystalline silicon film 11 having the target thickness H may be obtained.

For example, the thickness of the monocrystalline silicon wafer 1 is at least greater than the target thickness H. Further, the thickness of the monocrystalline silicon wafer 1 is greater than or equal to a minimum thickness required to ensure that the monocrystalline silicon body 12 is not damaged when the monocrystalline silicon body 12 is stripped off.

In S3, as shown in FIGS. 6A to 6G or FIGS. 7A to 7C, a substrate 3 is provided, and the monocrystalline silicon film 11 is transferred onto the substrate 3 by breaking the monocrystalline silicon wafer 1 at the bubble layer A.

In this step, after the monocrystalline silicon wafer 1 is broken at the bubble layer A, the monocrystalline silicon film 11 and the independent monocrystalline silicon body 12 are obtained. If the thickness of the independent monocrystalline silicon body 12 meets a pre-set requirement, the independent monocrystalline silicon body 12 may be used as a monocrystalline silicon wafer 1 again. That is, the independent monocrystalline silicon body 12 may be used as a monocrystalline silicon wafer 1 in which a bubble layer is to be formed in fabricating of other thin film transistor(s). In this way, the monocrystalline silicon wafer 1 may be used repeatedly to save costs.

Herein, the expression "pre-set requirement" refers to a thickness that the independent monocrystalline silicon body 12 needs to have so that it has the mechanical strength to ensure that a monocrystalline silicon body 12 can be stripped off in a case where the independent monocrystalline silicon body 12 is used as a monocrystalline silicon wafer 1 in fabricating the other thin film transistor(s).

Figure 7A:
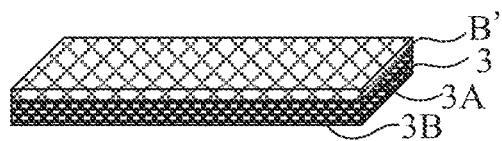
FIGS. 7A to 7C are some other diagrams showing steps in S3 of the method of manufacturing the thin film transistor(s), in accordance with some embodiments of the present disclosure.
Figure 7B:
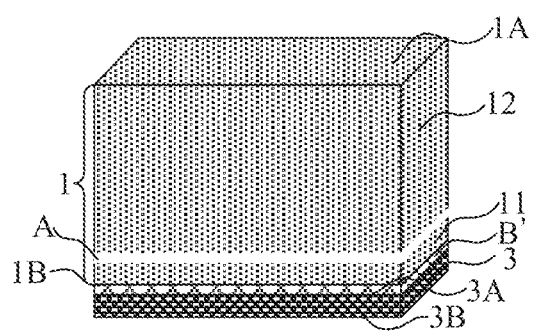
Figure 7C:
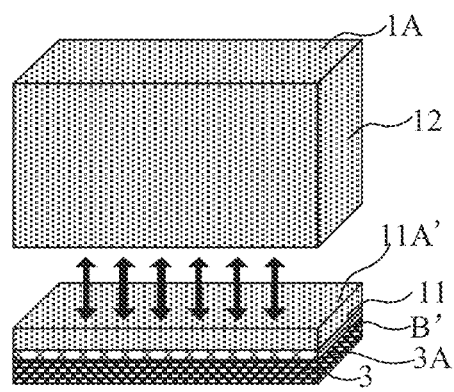
Figure 7D:
FIG. 7D is a diagram showing steps in S4 of the method of manufacturing the thin film transistors, in accordance with some embodiments of the present disclosure.

In S4, as shown in FIG. 7D, the monocrystalline silicon film 11 transferred to the substrate 3 is patterned to formed active layer(s) 110A of the thin film transistor(s), such as a plurality of active layers of thin film transistors.

In some embodiments, the monocrystalline silicon film 11 transferred to the substrate 3 is a whole layer of monocrystalline silicon film 11 covering the substrate 3. By patterning the whole layer of monocrystalline silicon film 11, active layers 110A of a plurality of thin film transistors are obtained. In this way, an efficiency of manufacturing thin film transistors may be improved, and rapid mass production may be realized.

In some embodiments, the substrate 3 includes a base substrate and a film-layer structure located on the base substrate.

The base substrate may be a substrate of a monocrystalline silicon material or a substrate of a non-monocrystalline silicon material. For example, the base substrate is a glass substrate or a flexible substrate. In a case where the base substrate is a flexible substrate, it may be made of polyimide (PI).

In the method of manufacturing the thin film transistor(s) provided by the foregoing embodiments of the present disclosure, by forming the bubble layer A in the monocrystalline silicon wafer 1, the monocrystalline silicon film 11 having the target thickness is formed between the bubble layer A and the second surface 1B of the monocrystalline silicon wafer 1. Then, the monocrystalline silicon wafer 1 is broken at the bubble layer A to transfer the monocrystalline silicon film 11 onto the substrate 3, so as to obtain the monocrystalline silicon film 11 having the target thickness H on the substrate 3, and use the monocrystalline silicon film 11 to form the active layer(s) 110A of the thin film transistor(s). In the above method of transferring the monocrystalline silicon film 11, there is no need to directly grow the monocrystalline silicon film 11 on the substrate 3. Therefore, there is no need for strict process conditions such as high temperature and high vacuum, and the above method may be implemented in relatively loose process conditions. For example, the requirements on base substrate material, temperature, and vacuum degree are lowered. Therefore, the above method may be applied to a case where active layer(s) of the monocrystalline silicon is manufactured on a base substrate of a non-monocrystalline silicon material such as glass, thereby reducing the difficulty of manufacturing monocrystalline silicon thin film transistors on a base substrate of a non-monocrystalline silicon material such as glass.

In addition, since the difficulty of manufacturing monocrystalline silicon thin film transistors on a base substrate of a non-monocrystalline silicon material is reduced, the method provided by the embodiments of the present disclosure may improve the efficiency of manufacturing monocrystalline silicon thin film transistors, and thereby achieve rapid mass production of thin film transistors with higher carrier mobility.

On this basis, display products such as mobile phones and computers generally use non-monocrystalline silicon materials such as glass as base substrates. The method of manufacturing the monocrystalline silicon thin film transistor(s) described above may be applied to the manufacture of thin film transistors of these display products. Due to the high carrier mobility and fast response speed of monocrystalline silicon thin film transistors, the performance of the display products may be improved by adopting monocrystalline silicon thin film transistors.

Moreover, thin film transistors manufactured by the method of manufacturing the monocrystalline silicon thin film transistor(s) described above may also be used in fingerprint identification modules, pressure recognition modules, etc. of display products such as mobile phones. Due to the high carrier mobility and fast response speed of monocrystalline silicon thin film transistors, a response speed and sensitivity of the modules may be improved.

In addition, the material of the active layer 110A of the thin film transistor manufactured by the method described above is monocrystalline silicon. Since monocrystalline silicon has a high carrier mobility, the manufactured monocrystalline silicon thin film transistor will have fast response speed and improved electrical properties. On the basis of ensuring a same response speed, a width-to-length ratio of the active layer of the monocrystalline silicon thin film transistor may be made smaller than that of a polycrystalline silicon thin film transistor or an amorphous silicon thin film transistor. Therefore, the size of the monocrystalline silicon thin film transistor may be reduced.

Besides, in the method described above, by controlling a position of the bubble layer, it may be possible to control the target thickness H (that is, the thickness of the monocrystalline silicon film). Therefore, the thickness of the monocrystalline silicon film 11 may be made very small, and the thickness of the active layer 110A may be reduced. As a result, a size of the thin film transistor may be reduced.

In this way, the size of the thin film transistor manufactured by the above method is reduced, which meets a miniaturization trend of the thin film transistor and thereby improves a light-emitting brightness and resolution of products adopting the thin film transistor.

In some embodiments, as shown in FIGS. 2 and 6A to 6G, the step of providing the substrate 3, and transferring the monocrystalline silicon film 11 onto the substrate 3 by breaking the monocrystalline silicon wafer 1 at the bubble layer A (i.e., S3) includes S31 to S34.

Figure 6A:
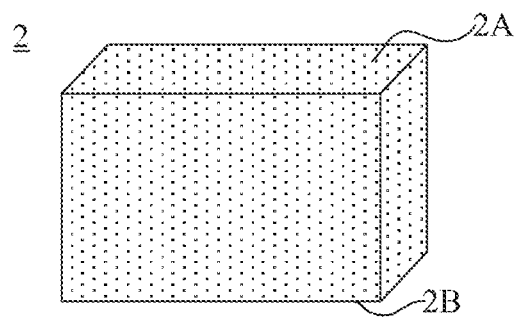
FIGS. 6A to 6G are diagrams showing steps in S3 of the method of manufacturing the thin film transistor(s), in accordance with some embodiments of the present disclosure.
Figure 6B:
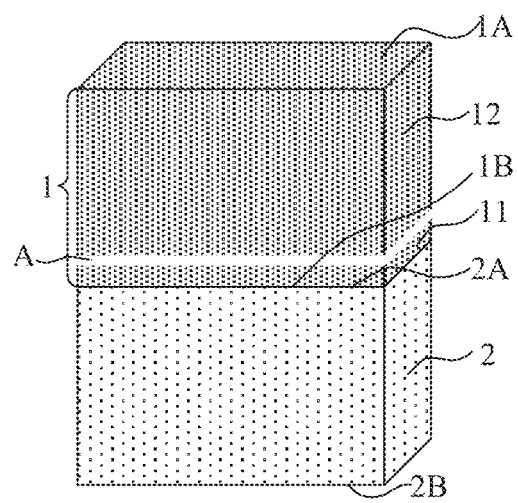
Figure 6C:
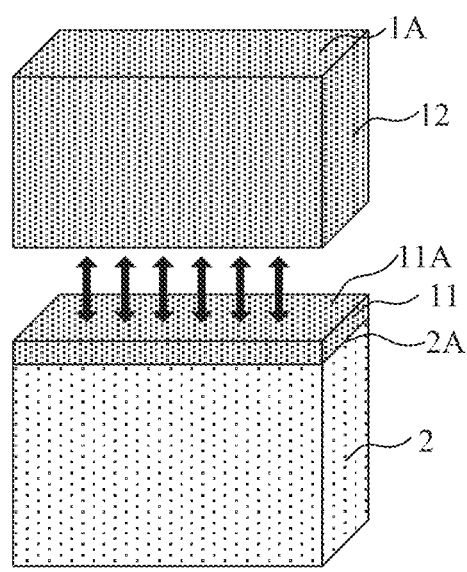
Figure 6D:
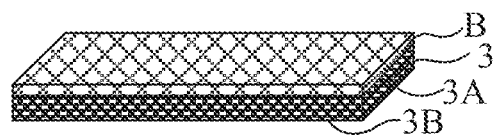
Figure 6E:
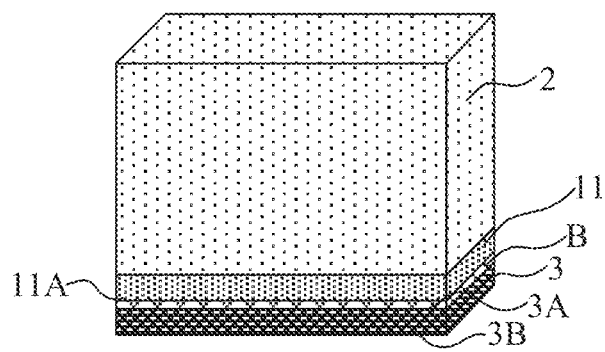
Figure 6F:
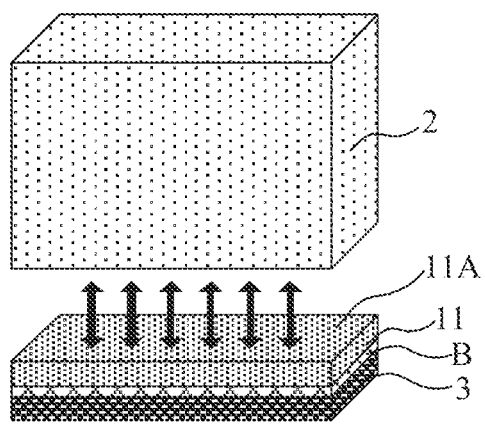
Figure 6G:
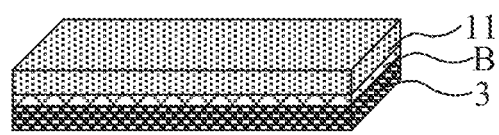
Figure 6H:
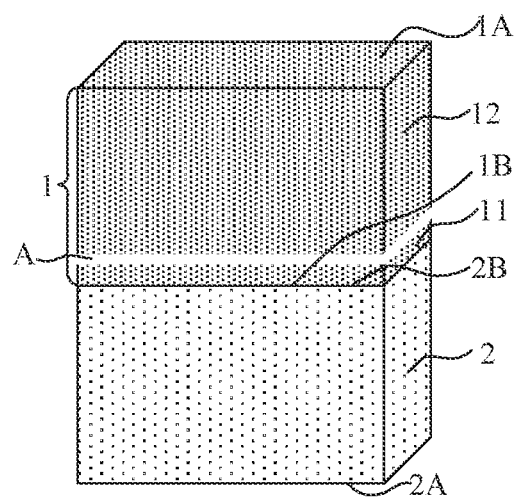
FIG. 6H is a diagram of a second surface of a monocrystalline silicon wafer being temporarily bonded to another surface of a temporary support base, in accordance with some embodiments of the present disclosure.
Figure 6I:
FIGS. 6I and 6J are diagrams showing a surface of a monocrystalline silicon film away from the temporary support base and another surface of a substrate being bonded together, in accordance with some embodiments of the present disclosure.

In S31, as shown in FIGS. 6A and 6B or FIGS. 6A and 6H, a temporary support base 2 is provided, and the second surface 1B of the monocrystalline silicon wafer 1 and a surface 2A or a surface 2B of the temporary support base 2 are temporarily bonded together. FIG. 6B shows a case where the second surface 1B of the monocrystalline silicon wafer 1 is temporarily bonded to the surface 2A of the temporary support base 2. FIG. 6H shows a case where the second surface 1B of the monocrystalline silicon wafer 1 is temporarily bonded to the surface 2B of the temporary support base 2.

In the above step, the temporary support base 2 plays a role of temporarily supporting the monocrystalline silicon film 11. After the monocrystalline silicon film 11 is transferred onto the substrate 3, the temporary support base 2 will be removed. Therefore, there is no special requirement for a material of the temporary support base 2.

For example, the temporary support base 2 is a monocrystalline silicon base, or a monocrystalline silicon base on a surface of which an oxide layer has been formed.

The step of the temporary bonding is described below by taking an example where the second surface 1B of the monocrystalline silicon wafer 1 is temporarily bonded to the surface 2A of the temporary support base 2. The step includes:

forming temporary bonding adhesive layer(s) on the second surface 1B of the monocrystalline silicon wafer 1 and/or the surface 2A of the temporary support base 2, respectively; aligning the second surface 1B of the monocrystalline silicon wafer 1 with the surface 2A of the temporary support base 2; and temporarily bonding the monocrystalline silicon wafer 1 and the temporary support base 2 together by a pressing or a hot-roll lamination process.

The temporary bonding adhesive layer(s) in the above process may be bonding adhesive of polyimide (PI), an acrylic polymer, a photosensitive gas generating agent, etc.

In S32, as shown in FIG. 6C, heat treatment is performed on the monocrystalline silicon wafer 1 and the temporary support base 2 that are temporarily bonded together to break the monocrystalline silicon wafer 1 at the bubble layer A, so that the monocrystalline silicon body 12 between the bubble layer A and the first surface 1A is stripped off, and the monocrystalline silicon film 11 remains on the surface 2A of the temporary support base 2.

For example, in the above step, a temperature for the heat treatment performed on the monocrystalline silicon wafer 1 and the temporary support base 2 that are temporarily bonded together is 400° C. to 600° C. During this process, the gas in the plurality of cavities of the bubble layer A in the monocrystalline silicon wafer 1 expands under heat, and the pressure in the cavities increases as the temperature increases. When the gas generates sufficient pressure due to expansion, the monocrystalline silicon wafer 1 is broken at the bubble layer A, and the monocrystalline silicon body 12 of the monocrystalline silicon wafer 1 is separated from the monocrystalline silicon film 11. In this way, the portion between the first surface 1A of the monocrystalline silicon wafer 1 and the bubble layer A (that is, the monocrystalline silicon body 12) is stripped off, and the monocrystalline silicon film 11 remaining on the surface 2A of the temporary support base 2 is obtained.

Figure 2:
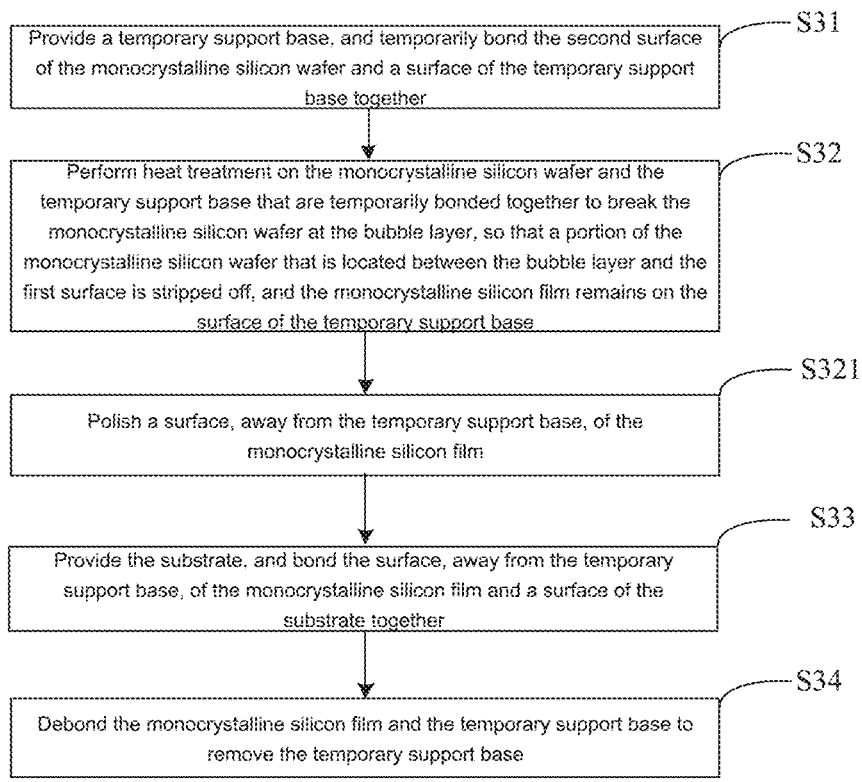
FIG. 2 is a flowchart of S3 in the method of manufacturing the thin film transistor(s), in accordance with some embodiments of the present disclosure.

In some embodiments, based on transferring the monocrystalline silicon film 11, with continued reference to FIG. 2, after S32 and before a subsequent step 33 (S33), the method of manufacturing the thin film transistor(s) further includes:

S321, polishing a surface 11A (as shown in FIG. 6C), away from the temporary support base 2, of the monocrystalline silicon film 11.

Since the surface 11A of the monocrystalline silicon film 11 away from the temporary support base 2 is obtained by breaking the monocrystalline silicon wafer 1 at the bubble layer A and striping off the monocrystalline silicon body 12, the surface 11A of the monocrystalline silicon film 11 away from the temporary support base 2 is very rough and not smooth. By polishing the surface 11A of the monocrystalline silicon film 11 away from the temporary support base 2, it may be possible to make the surface 11A of the monocrystalline silicon film 11 away from the temporary support base 2 smoother, and less rough. In this way, it may be possible to increase a firmness of bonding when the surface 11A of the monocrystalline silicon film 11 away from the temporary support base 2 and a surface 3A of the substrate 3 are bonded together.

For example, the surface 11A of the monocrystalline silicon film 11 away from the temporary support base 2 is polished by plasma etching, chemical etching, or chemical mechanical planarization, etc.

Figure 6J:
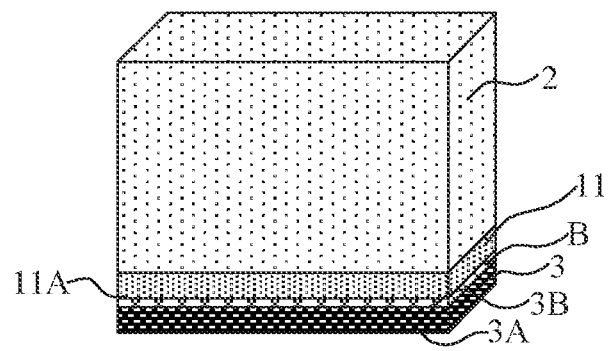

In S33, as shown in FIGS. 6D and 6E or FIGS. 6I and 6J, the substrate 3 is provided, and the surface 11A, away from the temporary support base 2, of the monocrystalline silicon film 11 and the surface 3A or a surface 3B of the substrate 3 are bonded together. FIG. 6E illustrates a case where the surface 11A of the monocrystalline silicon film 11 away from the temporary support base 2 and the surface 3A of the substrate 3 are bonded together. FIG. 6J illustrates a case where the surface 11A of the monocrystalline silicon film 11 away from the temporary support base 2 and the surface 3B of the substrate 3 are bonded together.

A specific bonding process is described below by taking an example in which the surface 11A of the monocrystalline silicon film 11 away from the temporary support base 2 and the surface 3A of the substrate 3 are bonded together.

Figure 6K:
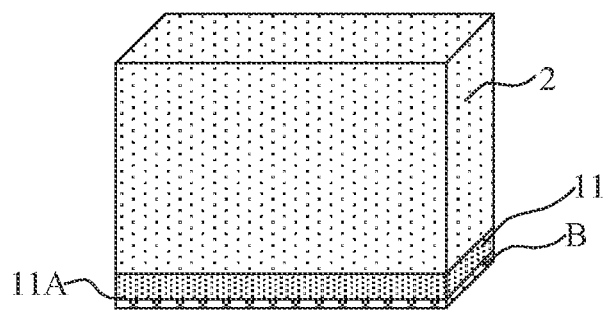
FIG. 6K is a diagram of forming a first bonding adhesive layer on the surface of the monocrystalline silicon film away from the temporary support base, in accordance with some embodiments of the present disclosure.
Figure 6L:
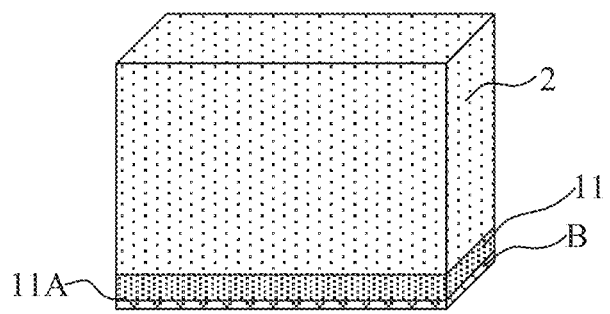

In some embodiments, before bonding the surface 11A, away from the temporary support base 2, of the monocrystalline silicon film 11 and the surface 3A of the substrate 3 together (i.e., before S33), the method of manufacturing the thin film transistor(s) further includes: as shown in FIG. 6K, forming a first bonding adhesive layer B on the surface 11A, away from the temporary support base 2, of the monocrystalline silicon film 11; and/or, as shown in FIG. 6D, forming a first bonding adhesive layer B on the surface 3A of the provided substrate 3. FIG. 6D illustrates a case where the first bonding adhesive layer B is formed on the surface 3A of the substrate 3. FIG. 6K illustrates a case where the first bonding adhesive layer B is formed on the surface 11A of the monocrystalline silicon film 11 away from the temporary support base 2.

The monocrystalline silicon film 11 and the substrate 3 may be bonded more firmly by forming the first bonding adhesive layer B. The formed first bonding adhesive layer B may be a permanent bonding adhesive layer. The formed first bonding adhesive layer B may be made from a phase transformation alloy (PCA), or other materials. PCA is characterized by being able to rapidly switch between a conductor and an insulator under certain conditions.

The step of bonding the surface 11A of the monocrystalline silicon film 11 away from the temporary support base 2 and the surface 3A of the substrate 3 together, includes: coating a region to be bonded with PCA; performing phase transformation treatment on regions that need to be turned on to convert them into conductors, and keeping other regions at an insulating state; and then performing face-to-face bonding in interconnection regions.

For example, the surface 3A of the substrate 3 is coated with PCA; phase transformation treatment is performed on the regions that need to be turned on to convert them into conductors, and other regions are kept at an insulating state; and then face-to-face bonding is performed in the interconnection regions of the surface 11A of the monocrystalline silicon film 11 away from the temporary support base 2.

It will be noted that, in some examples, the method of manufacturing the thin film transistor(s) further includes the step of polishing the surface 11A of the monocrystalline silicon film 11 away from the temporary support base 2 (that is, includes S321) before the step of bonding the surface 11A of the monocrystalline silicon film 11 away from the temporary support base 2 and the surface 3A of the substrate 3 together (i.e., before S33). In this case, the step of forming the first bonding adhesive layer B on the surface 3A, to be bonded with the monocrystalline silicon film 11, of the provided substrate 3 is performed after polishing the surface 11A of the monocrystalline silicon film 11 away from the temporary support base 2. In this way, polishing is performed first, and then the first bonding adhesive layer is formed to facilitate bonding, which further improves a stability and conductivity of bonding.

In S34, as shown in FIGS. 6F and 6G, the monocrystalline silicon film 11 and the temporary support base 2 are debonded to remove the temporary support base 2.

For example, in the above step, a laser-assisted method is adopted to use laser (e.g., ultraviolet light) to irradiate the temporary bonding adhesive layer. Since the temporary bonding adhesive layer includes the photosensitive gas generating agent, a gas is generated inside the adhesive layer under laser irradiation, and a volume of the temporary bonding adhesive layer increases due to expansion of the generated gas. As a result, the adhesion of the temporary bonding adhesive layer between the monocrystalline silicon film 11 and the temporary support base 2 is reduced; the temporary bonding adhesive layer is degraded, and the temporary support base 2 is separated from the monocrystalline silicon film 11 to remove the temporary support base 2, thereby realizing the purpose of transferring the monocrystalline silicon film 11 onto the substrate 3.

The above embodiments provide a manner of transferring the monocrystalline silicon film 11 onto the substrate 3, where the temporary support base 2 plays a role of temporarily supporting the monocrystalline silicon film 11. The monocrystalline silicon film 11 is first transferred to the temporary support base 2, then the monocrystalline silicon film 11 remaining on the temporary support base 2 is transferred onto the substrate 3, and finally the temporary support base 2 is removed. In the above process, during the processes of performing heat treatment on the monocrystalline silicon wafer 1 and the temporary support base 2 to break the monocrystalline silicon wafer 1 at the bubble layer A, and striping off the monocrystalline silicon body 12, no operation is directly performed on the substrate 3. Therefore, the substrate 3 will not be affected by such factors as temperature rise, or a reaction force caused by breakage of the monocrystalline silicon wafer 1 and striping off the monocrystalline silicon body 12, thereby ensuring that the substrate 3 is not damaged while obtaining the monocrystalline silicon film 11 on the substrate 3.

In some other embodiments, as shown in FIGS. 3 and 7A to 7C, the step of providing the substrate 3, and transferring the monocrystalline silicon film 11 onto the substrate 3 by breaking the monocrystalline silicon wafer 1 at the bubble layer A (i.e., S3), includes S31' to S33'.

Figure 8A:
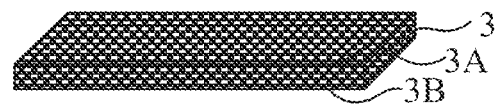
FIGS. 8A and 8B are diagrams showing the second surface of the monocrystalline silicon wafer and another surface of the substrate being bonded together, in accordance with some embodiments of the present disclosure.
Figure 8B:
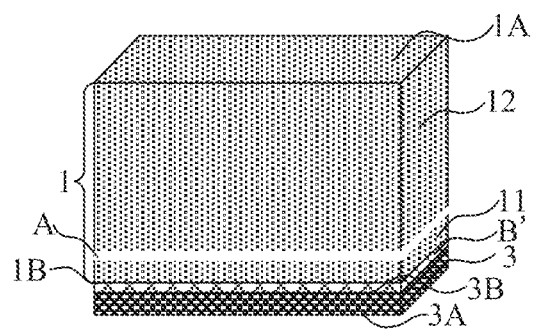

In S31', as shown in FIGS. 7A and 7B or FIGS. 8A and 8B, the substrate 3 is provided, and the second surface 1B of the monocrystalline silicon wafer 1 and a surface 3A or a surface 3B of the substrate 3 are bonded together. FIG. 7B illustrates a case where the second surface 1B of the monocrystalline silicon wafer 1 and the surface 3A of the substrate 3 are bonded together. FIG. 8B illustrates a case where the second surface 1B of the monocrystalline silicon wafer 1 and the surface 3B of the substrate 3 are bonded together.

The bonding of the second surface 1B of the monocrystalline silicon wafer 1 and the surface 3A of the substrate 3 may be permanent bonding. In this case, the monocrystalline silicon film 11 and the substrate 3 are permanently interconnected. The permanent bonding method is simple, reliable, and incurs lower cost.

A specific bonding process is described below by taking an example in which the second surface 1B of the monocrystalline silicon wafer 1 and the surface 3A of the substrate 3 are bonded together.

Figure 8C:
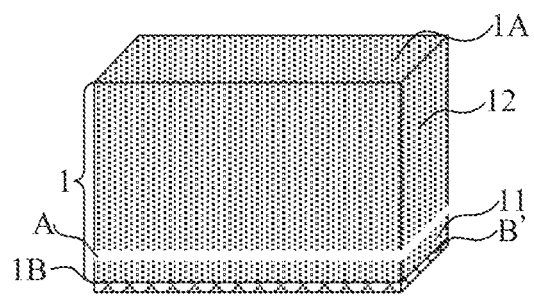
FIG. 8C is a diagram of forming a second bonding adhesive layer on the second surface of the monocrystalline silicon wafer, in accordance with some embodiments of the present disclosure.

In some embodiments, before bonding the second surface 1B of the monocrystalline silicon wafer 1 and the surface 3A of the substrate 3 together (i.e., before S31'), the method further includes: as shown in FIG. 8C, forming a second bonding adhesive layer B' on the second surface 1B of the monocrystalline silicon wafer 1; and/or, as shown in FIG. 7A, forming a second bonding adhesive layer B' on the surface 3A of the provided substrate 3. FIG. 7A illustrates a case where the second bonding adhesive layer B' is formed on the surface 3A of the substrate 3. FIG. 8C illustrates a case where the second bonding adhesive layer B' is formed on the second surface 1B of the monocrystalline silicon wafer 1.

The second bonding adhesive layer B' may be made of the same material as the first bonding adhesive layer B in S33 of the foregoing embodiments. The formed second bonding adhesive layer B' is a permanent bonding adhesive layer.

In this step, the manner of bonding the second surface 1B of the monocrystalline silicon wafer 1 and the surface 3A of the substrate 3 together is similar to the method in S33 described in the foregoing embodiments, and details are not repeated here.

In S32', as shown in FIG. 7C, heat treatment is performed on the monocrystalline silicon wafer 1 and the substrate 3 that are bonded together to break the monocrystalline silicon wafer 1 at the bubble layer A, so that the monocrystalline silicon body 12 between the first surface 1A of the monocrystalline silicon wafer 1 and the bubble layer A is stripped off, and the monocrystalline silicon film 11 remains on the surface 3A of the substrate 3.

For example, in the above step, a temperature for the heat treatment performed on the monocrystalline silicon wafer 1 and the substrate 3 that are bonded together is 400° C. to 600° C. During this process, the gas in the plurality of cavities of the bubble layer A in the monocrystalline silicon wafer 1 expands under heat, and the pressure in the cavities increases as the temperature increases. When the gas generates sufficient pressure due to expansion, the monocrystalline silicon wafer 1 is broken at the bubble layer A, and the monocrystalline silicon body 12 of the monocrystalline silicon wafer 1 is separated from the monocrystalline silicon film 11. In this way, the portion between the first surface 1A of the monocrystalline silicon wafer 1 and the bubble layer A (that is, the monocrystalline silicon body 12) is stripped off, and the monocrystalline silicon film 11 remaining on the surface 3A of the substrate 3 is obtained.

The above embodiments provide another manner of transferring the monocrystalline silicon film 11 onto the substrate 3. In the above method, the monocrystalline silicon wafer 1 is directly bonded to the substrate 3, therefore after the monocrystalline silicon wafer 1 is broken at the bubble layer A, the monocrystalline silicon film 11 can be obtained on the substrate 3. This process is simple with simplified manufacturing steps, and thus the manufacturing efficiency is high.

Figure 3:
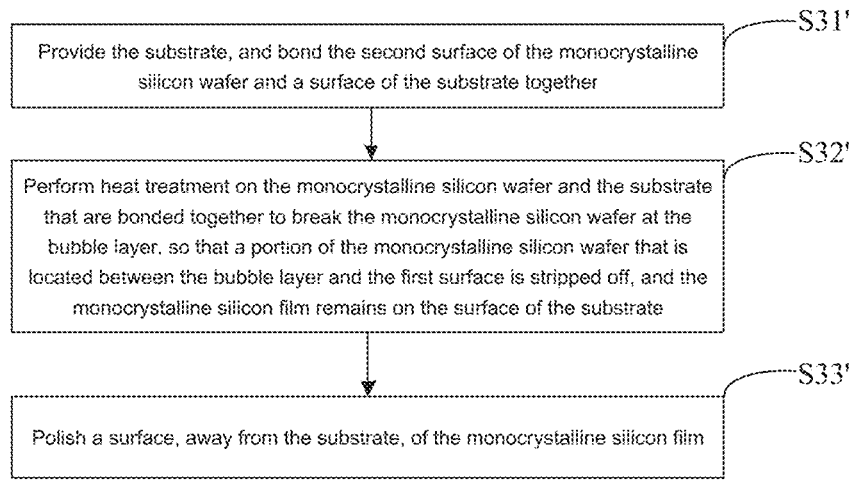
FIG. 3 is another flowchart of S3 in the method of manufacturing the thin film transistor(s), in accordance with some embodiments of the present disclosure.

In some embodiments, based on the above manner of transferring the monocrystalline silicon film 11, with continued reference to FIG. 3, the method of manufacturing the thin film transistor(s) further includes:

S33', polishing a surface 11A', away from the substrate 3, of the monocrystalline silicon film 11 remaining on the surface 3A of the substrate 3.

Since the monocrystalline silicon film 11 is obtained by breaking the monocrystalline silicon wafer 1 at the bubble layer A and stripping off the monocrystalline silicon body 12, the surface 11A' of the monocrystalline silicon film 11 away from the substrate 3 is very rough and not smooth. By polishing the surface 11A' of the monocrystalline silicon film 11 away from the substrate 3, it may be possible to make the surface 11A' of the monocrystalline silicon film 11 away from the substrate 3 smoother, and less rough. In this way, it may be possible to increase the firmness of bonding between a formed film layer and the monocrystalline silicon film 11 when manufacturing other layers of the TFT on the surface 11A' of the monocrystalline silicon film 11 away from the substrate 3 in subsequent steps.

As for the method of polishing the surface 11A' of the monocrystalline silicon film 11 away from the substrate 3, reference may be made to the description of S321 in the above embodiments, and details are not repeated here.

In some embodiments, in the two manners of transferring the monocrystalline silicon film 11 described above, as for the manner shown in FIGS. 6A to 6G, before providing the temporary support base 2 and temporarily bonding the second surface 1B of the monocrystalline silicon wafer 1 and the surface 2A of the temporary support base 2 together (i.e., before S31), the method of manufacturing the thin film transistor(s) further includes: polishing the second surface 1B (as shown in FIG. 5) of the monocrystalline silicon wafer 1. Or, as for the manner shown in FIGS. 7A to 7C, before bonding the second surface 1B of the monocrystalline silicon wafer 1 and the surface 3A of the substrate 3 together (i.e., before S31'), the method of manufacturing the thin film transistor(s) further includes: polishing the second surface 1B (as shown in FIG. 5) of the monocrystalline silicon wafer 1.

In the above step, by polishing the second surface 1B of the monocrystalline silicon wafer 1, it may be possible to make the second surface 1B of the monocrystalline silicon wafer 1 smoother, and less rough. In this way, the firmness of bonding may be increased when the second surface 1B of the monocrystalline silicon wafer 1 is temporarily bonded to the surface 2A of the temporary support base 2, or when the second surface 1B of the monocrystalline silicon wafer 1 is bonded to the surface 3A of the substrate 3.

For example, the second surface 1B of the monocrystalline silicon wafer 1 may be polished by plasma etching, chemical etching, or chemical mechanical planarization, etc.

Figure 9:
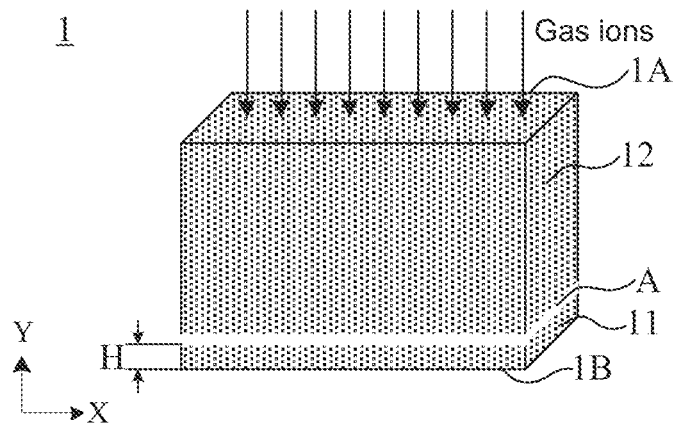
FIG. 9 is a diagram showing steps in S1 of forming the bubble layer in the method of manufacturing the thin film transistor(s), in accordance with some embodiments of the present disclosure.
Figure 10:
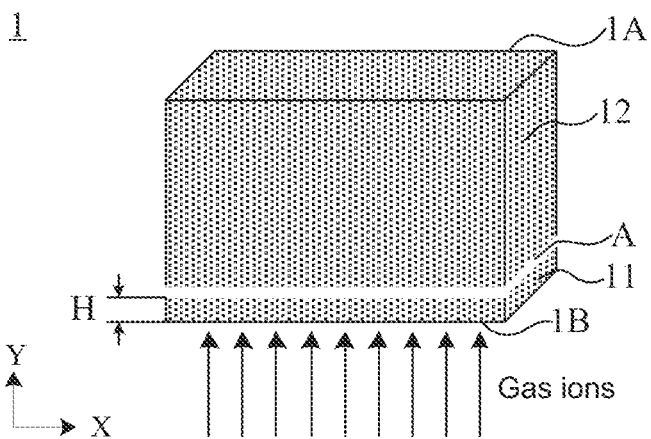
FIG. 10 is another diagram showing steps in S1 of forming the bubble layer in the method of manufacturing the thin film transistor(s), in accordance with some embodiments of the present disclosure.

In some embodiments, as shown in FIGS. 9 and 10, forming the bubble layer A between the first surface 1A and the second surface 1B of the monocrystalline silicon wafer 1 (i.e., S2), includes:

implanting gas ions into the monocrystalline silicon wafer 1 from the first surface 1A or the second surface 1B of the monocrystalline silicon wafer 1 by using an ion implantation process. A depth of ion implantation is controlled to form the bubble layer at a pre-determined position between the first surface 1A and the second surface 1B of the monocrystalline silicon wafer 1. A distance H between the bubble layer A and the second surface 1B is the target thickness.

In the above embodiments, gas ions with certain energy are implanted into the monocrystalline silicon wafer 1 by using an ion implantation process. The gas ions and silicon atoms in the monocrystalline silicon wafer 1 undergo a series of physical and chemical reactions, resulting in the implanted gas ions gradually losing energy and finally staying in the monocrystalline silicon wafer 1. The gas ions form a gas in the monocrystalline silicon wafer 1, thus forming the bubble layer A in the monocrystalline silicon wafer 1.

For example, the gas ions are hydrogen ions, helium ions, etc. Taking hydrogen ions as an example, the hydrogen ions are implanted into the monocrystalline silicon wafer 1 from the first surface 1A or the second surface 1B of the monocrystalline silicon wafer 1. When the hydrogen ions enter the monocrystalline silicon wafer 1, the hydrogen ions will break the silicon-silicon bonds and form point defects in the silicon, and silicon-hydrogen bonds will form. These point defects will form a plurality of cavities, and hydrogen gas is generated in the cavities to fill the cavities, thereby forming the bubble layer A.

Since a depth of ion implantation is related to the amount of energy of ion implantation, a corresponding ion implantation depth may be obtained according to the target thickness of the monocrystalline silicon film 11 to be formed, and then gas ions with a corresponding amount of energy may be implanted into the monocrystalline silicon wafer 1 to make the gas ions reach a depth within a pre-set depth range. The gas ions will stay in the monocrystalline silicon wafer 1, and form the bubble layer A at a specific position between the first surface 1A and the second surface 1B of the monocrystalline silicon wafer 1. In this way, the thickness H of the obtained monocrystalline silicon film 11 is the target thickness.

In some embodiments, as shown in FIG. 9, the gas ions are implanted into the monocrystalline silicon wafer 1 from the first surface 1A thereof. The depth of ion implantation is controlled within a first pre-set depth range, so that the bubble layer A is formed at a pre-determined position between the first surface 1A and the second surface 1B of the monocrystalline silicon wafer.

In some other embodiments, as shown in FIG. 10, the gas ions are implanted into the monocrystalline silicon wafer 1 from the second surface 1B thereof. The depth of ion implantation is controlled within a second pre-set depth range, so that the bubble layer A is formed at a pre-determined position between the first surface 1A and the second surface 1B of the monocrystalline silicon wafer 1.

It will be noted that, since the thickness H of the monocrystalline silicon film 11 is the target thickness, the bubble layer A is formed at the same position whether the gas ions are implanted from the first surface 1A or the second surface 1B of the monocrystalline silicon wafer 1.

It will be noted that, as can be known from the above embodiments, the monocrystalline silicon body 12 needs to have a certain thickness to ensure that it has sufficient mechanical strength and can be stripped off smoothly. Therefore, values in the first pre-set depth range at which the gas ions are implanted from the first surface 1A of the monocrystalline silicon wafer 1 is larger than values in the second pre-set depth range at which the gas ions are implanted from the second surface 1B of the monocrystalline silicon wafer 1. Moreover, since the energy required for ion implantation is related to the depth of ion implantation, the energy required for ion implantation from the first surface 1A of the monocrystalline silicon wafer 1 is greater than the energy required for ion implantation from the second surface 1B of the monocrystalline silicon wafer 1.

By using the above method to implant the gas ions into the monocrystalline silicon wafer 1 to form the bubble layer A, it may be possible to control the energy of ion implantation to control the depth of ion implantation, and thereby control the position of the formed bubble layer A. Therefore, the monocrystalline silicon film 11 having the target thickness may be obtained in subsequent steps, which has a high manufacturing accuracy.

Figure 11:
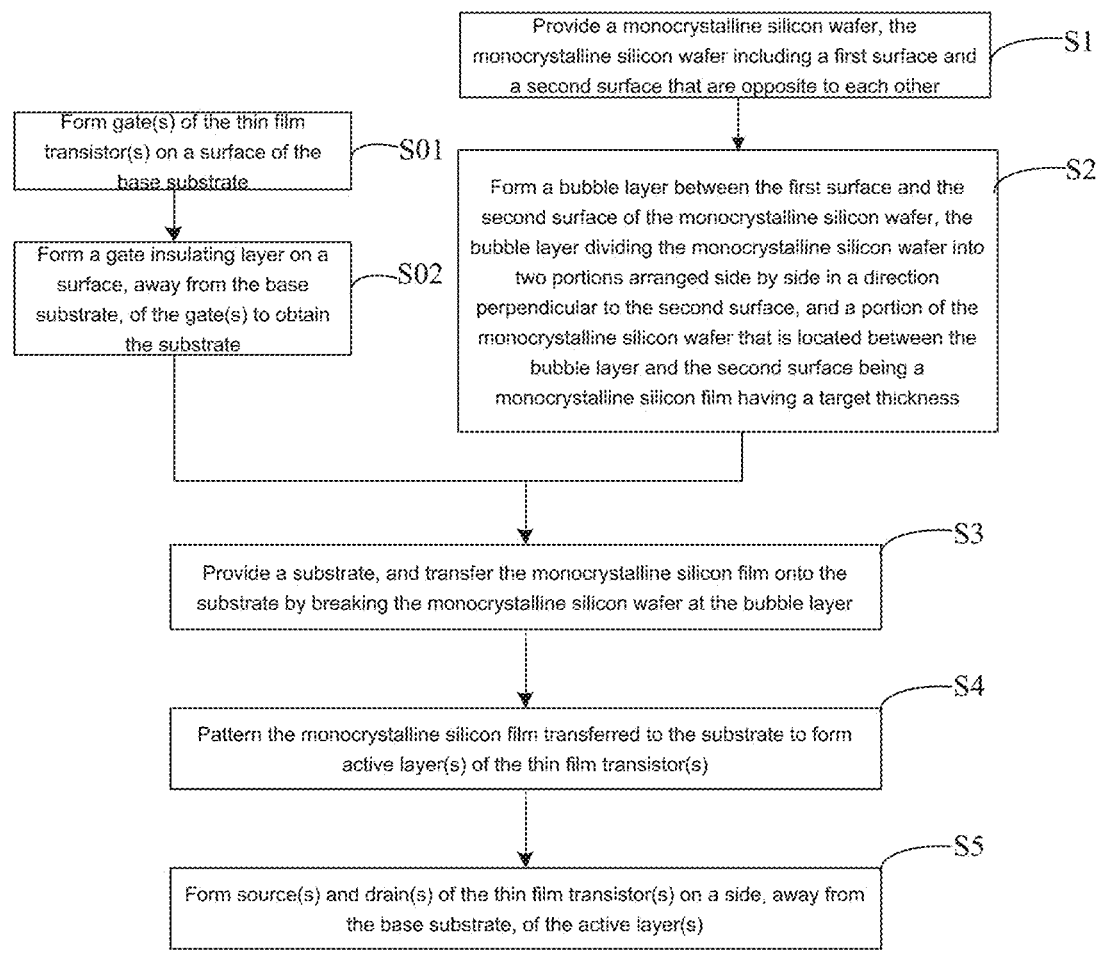
FIG. 11 is a flowchart of another method of manufacturing thin film transistor(s), in accordance with some embodiments of the present disclosure.
Figure 12:
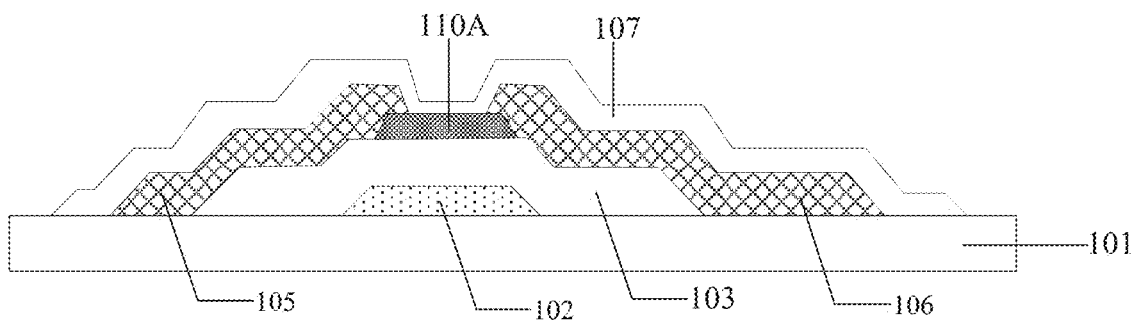
FIG. 12 is a section view of a thin film transistor, in accordance with some embodiments of the present disclosure.

In some embodiments, as shown in FIGS. 11 and 12, before the step of providing the substrate 3, the method of manufacturing the thin film transistor(s) further includes a step of manufacturing the substrate 3. The step includes:

S01, forming gate(s) 102 of the thin film transistor(s) 10 on a side of the base substrate 101; and S02, forming a gate insulating layer 103 on a surface, away from the base substrate 101, of the gate(s) 102.

In some embodiments, as shown in FIGS. 11 and 12, after patterning the monocrystalline silicon film 11 transferred to the substrate 3 to form the active layer(s) 110A of the thin film transistor(s) 10 (i.e., after S4), the method of manufacturing the thin film transistor(s) further includes:

S5, forming source(s) 105 and drain(s) 106 of the thin film transistor(s) 10 on a side, away from the base substrate 101, of the active layer(s) 110A.

The thin film transistor with a bottom-gate structure may be obtained by the above method, and the structure of the manufactured thin film transistor is as shown in FIG. 12.

With continued reference to FIG. 12, after forming the source 105 and drain 106, a passivation layer 107 may further be formed on a side, away from the base substrate 101, of the source 105 and drain 106. The passivation layer 107 covers both the source 105 and the drain 106, and the active layer 110A.

Figure 13:
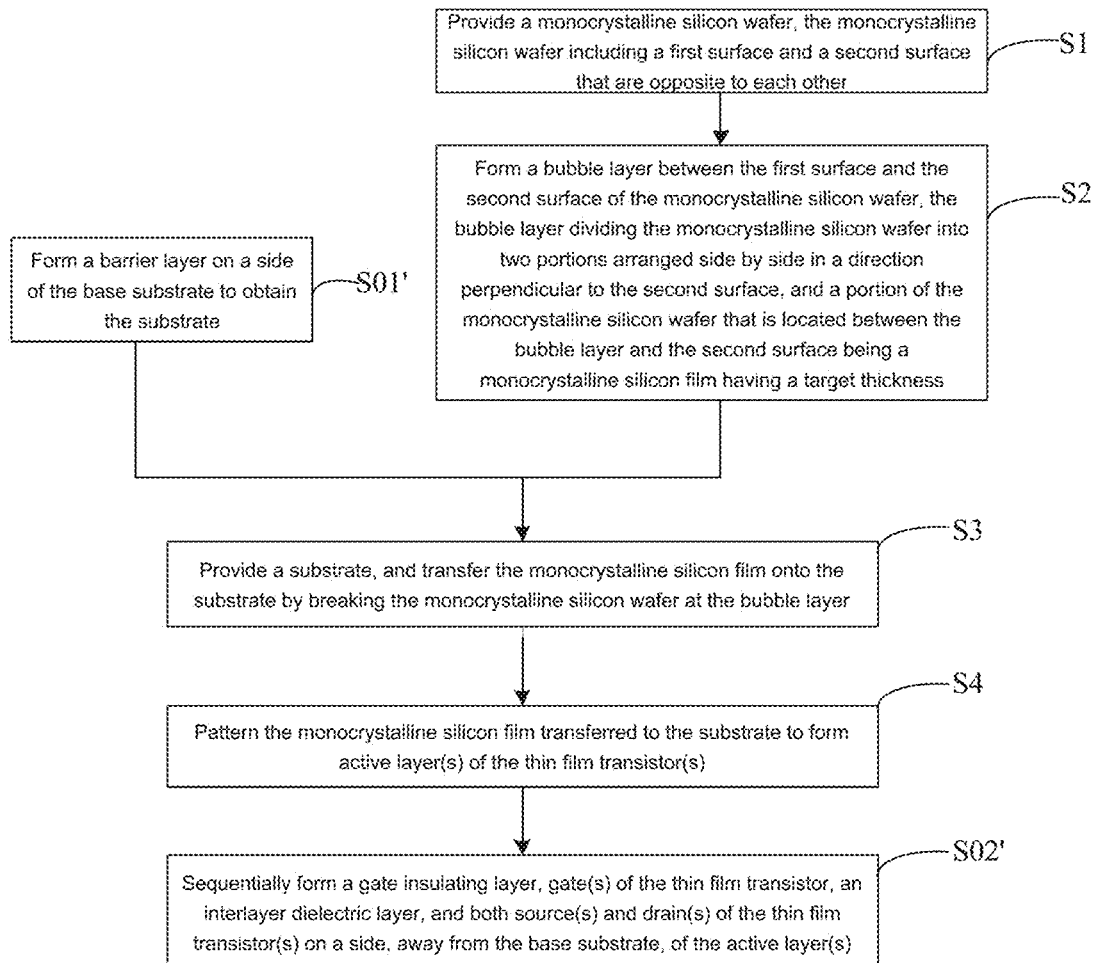
FIG. 13 is a flowchart of yet another method of manufacturing thin film transistor(s), in accordance with some embodiments of the present disclosure.
Figure 14:
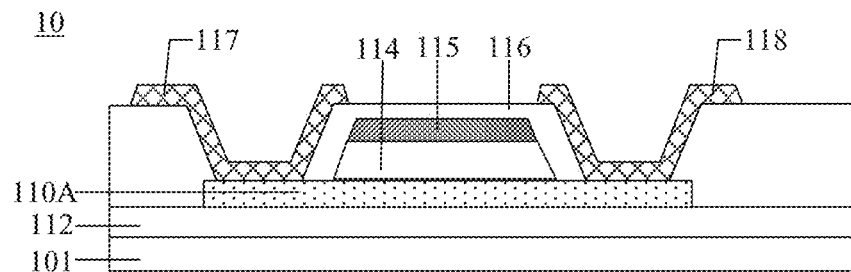
FIG. 14 is a section view of another thin film transistor, in accordance with some embodiments of the present disclosure.

In some other embodiments, as shown in FIGS. 13 and 14, before the step of providing the substrate 3, the method of manufacturing the thin film transistor(s) further includes a step of manufacturing the substrate 3. The step includes:

S01', forming a barrier layer 112 on a side of the base substrate 101.

In some embodiments, as shown in FIGS. 13 and 14, after patterning the monocrystalline silicon film 11 transferred to the substrate 3 to form the active layer(s) 110A of the thin film transistor(s) 10 (i.e., after S4), the method of manufacturing the thin film transistor(s) further includes:

S02', sequentially forming a gate insulating layer 114, gate(s) 115 of the thin film transistor(s), an interlayer dielectric layer 116, and both source(s) 117 and drain(s) 118 of the thin film transistor(s) on a side, away from the base substrate 101, of the active layer(s) 110A.

The interlayer dielectric layer 116 is provided with via holes, and the source 117 and the drain 118 of the thin film transistor are connected to the active layer 110A through the via holes provided in the interlayer dielectric layer 116.

A thin film transistor with a top-gate structure may be obtained by the above method, and the structure of the manufactured thin film transistor is as shown in FIG. 14.

In S5 and S02' in some of the above embodiments, the source and the drain of the thin film transistor 10 may be disposed in a same layer. The expression "same layer" refers to a layer structure formed by forming a film for forming a specific pattern through the same film-forming process and then performing a single patterning process by utilizing the same mask. Depending on the specific patterns, the single patterning process may include multiple exposure, development or etching processes, and the specific patterns in the formed layer structure may be continuous or discontinuous and may be at different heights or have different thicknesses.

Some embodiments of the present disclosure further provide a thin film transistor 10. As shown in FIGS. 12 and 14, the thin film transistor 10 includes a base substrate 101 and an active layer 110A disposed above the base substrate 101. A material of the base substrate 101 is a non-monocrystalline silicon material. The active layer 110A is a monocrystalline silicon layer, and the active layer 110A is manufactured by the method of manufacturing the thin film transistor provided by the embodiments of the present disclosure.

Since the material of the base substrate 101 of the thin film transistor 10 provided in the foregoing embodiments of the present disclosure is a non-monocrystalline silicon material, the monocrystalline silicon thin film transistor may be applied to mobile phones, computers, and other display products, the base substrates of which are made of a non-monocrystalline silicon material such as glass. Since monocrystalline silicon thin film transistors have a high carrier mobility and fast response speed, on the premise of ensuring that all thin film transistors have the same carrier mobility and response speed, the thin film transistors in the above-mentioned display products may be made smaller than other types of thin film transistors, which is conducive to improving the resolution of the display products.

In some embodiments, the thin film transistor 10 is of a bottom-gate structure. As shown in FIG. 12, in addition to the base substrate 101 and the active layer 110A, the thin film transistor of the bottom-gate structure further includes a gate 102 and a gate insulating layer 103 that are disposed between the base substrate 101 and the active layer 110A, and a source 105 and a drain 106 that are disposed on a side, away from the base substrate 101, of the active layer 110A.

In some other embodiments, the thin film transistor 10 is of a top-gate structure. As shown in FIG. 14, in addition to the base substrate 101 and the active layer 110A, the thin film transistor of the top-gate structure further includes: a barrier layer 112 disposed between the base substrate 101 and the active layer 110A, a gate insulating layer 114 disposed on a surface, away from the base substrate 101, of the active layer 110A, a gate 115 of the thin film transistor disposed on a surface, away from the base substrate 101, of the gate insulating layer 114, an interlayer dielectric layer 116 disposed on a surface, away from the base substrate 101, of the gate 115 of the thin film transistor, and a source electrode 117 and a drain 118 that are disposed on a surface, away from the base substrate 101, of the interlayer dielectric layer 116. The interlayer dielectric layer 116 is provided with via holes, and the source 117 and the drain 118 are connected to the active layer 110A through the via holes provided in the interlayer dielectric layer 116.

In some embodiments, the base substrate 101 is a glass substrate or a resin substrate.

In some embodiments, the base substrate 101 is a flexible substrate or a rigid substrate.

The active layer 110A of the thin film transistor 10 provided in the foregoing embodiments of the present disclosure is obtained by the method of manufacturing the thin film transistor 10 provided in the foregoing embodiments. Therefore, by controlling the position of the bubble layer A, it may be possible to control the thickness H of the monocrystalline silicon film 11 and thus reduce the thickness of the active layer 110A of the thin film transistor 10, thereby realizing miniaturization of the monocrystalline silicon TFT 10.

For example, the thickness of the active layer 110A is 1 μm to 10 μm, e.g., 1 μm, 3 μm, 5 μm, 7 μm or 10 μm.

Figure 15:
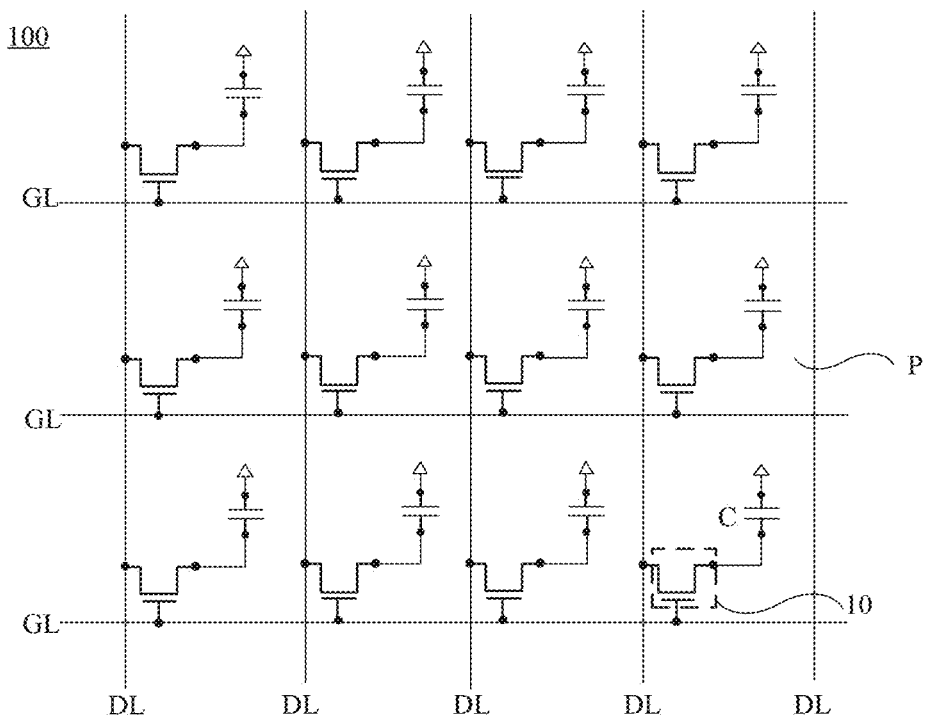
FIG. 15 is a top view of an array substrate, in accordance with some embodiments of the present disclosure.

As shown in FIG. 15, some embodiments of the present disclosure further provide an array substrate 100, which includes a plurality of thin film transistors 10 formed by the method described in the above embodiments. In this case, in the foregoing method of manufacturing the thin film transistor(s), the thin film transistor(s) include the plurality of thin film transistors.

The array substrate 100 may be applied to a liquid crystal display (LCD) apparatus, an organic light-emitting diode (OLED) display apparatus, a mini light-emitting diode (Mini LED) display apparatus, or a micro light-emitting diode (Micro LED) display apparatus, etc.

As shown in FIG. 15, in an example where the array substrate 100 is an array substrate in a LCD apparatus, the array substrate 100 includes a plurality of sub-pixels P, and each sub-pixel P is provided therein with a thin film transistor 10 and a liquid crystal capacitor C. A gate of the thin film transistor 10 is connected to a gate line GL, a first electrode of the thin film transistor 10 is connected to a data line DL, and a second electrode of the thin film transistor 10 is connected to the liquid crystal capacitor C. The thin film transistor 10 is used for transmitting data signals on the data line DL to the liquid crystal capacitor C. For example, the first electrode of the thin film transistor 10 is a source, and the second electrode of the thin film transistor 10 is a drain. Or, the second electrode of the thin film transistor 10 is the source, and the first electrode of the thin film transistor 10 is the drain.

The array substrate 100 described above includes a plurality of thin film transistors 10 manufactured by the method provided in some of the above embodiments. Since the thin film transistor 10 in the embodiments of the present disclosure adopts an active layer 110A of a monocrystalline silicon material, the thin film transistor 10 has a high carrier mobility and fast response speed. On the premise of ensuring that all thin film transistors have the same carrier mobility and response speed, the thin film transistors 10 in the array substrate 100 may be made smaller than other types of thin film transistors, which is conducive to realizing high density and high integration of the array substrate 100 and improving the operating performance of the array substrate 100.

Figure 16:
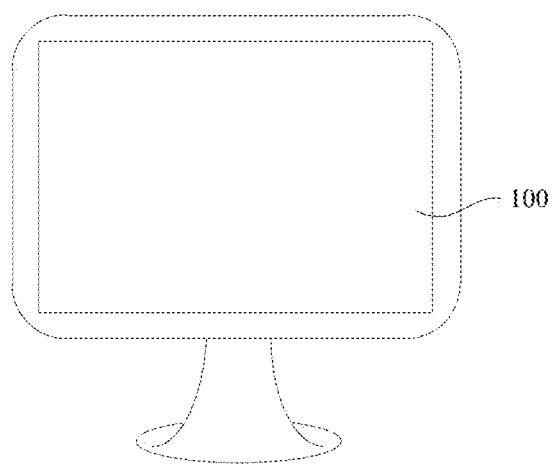
FIG. 16 is a schematic diagram of a display apparatus, in accordance with some embodiments of the present disclosure.

As shown in FIG. 16, some embodiments of the present disclosure further provide a display apparatus 500. The display apparatus 500 includes the array substrate 100 described above. The display apparatus 500 may realize high-resolution display with good display effect.

Some embodiments of the present disclosure further provide a biometric device. The biometric device includes at least one biometric sensor, and each biometric sensor includes at least one thin film transistor manufactured by the method as described above. In this case, in the foregoing method of manufacturing the thin film transistor(s), the thin film transistor(s) include the at least one thin film transistor.

Since the thin film transistor has a fast response speed, a small size, and good performance, it may be possible to improve a signal conversion speed and transmission speed of the biometric sensor and thereby improve a response speed and sensitivity of the biometric device. Moreover, a size of the biometric sensor may be reduced, which meets a miniaturization requirement of the biometric device and in turn reduces a space occupied by the biometric device in a product to which it is applied (such as a mobile phone).

Figure 17:
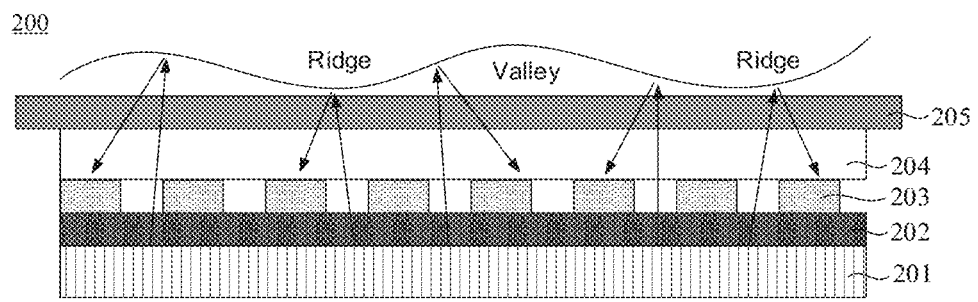
FIG. 17 is a schematic diagram of a biometric device, in accordance with some embodiments of the present disclosure.

In some embodiments, the biometric device is a device that may realize off-screen fingerprint recognition. As shown in FIG. 17, the biometric device 200 further includes a light source 201, a transparent substrate 202, a light guide layer 204, and a cover plate 205. The plurality of biometric sensors 203 are disposed on a surface of the transparent substrate 202 and are arranged in an array. The light source 201 is disposed on a side, away from the plurality of biometric sensors 203, of the transparent substrate 202. The light guide layer 204 is disposed on a side, away from the transparent substrate 202, of the plurality of biometric sensors 203. The cover plate 205 is disposed on a side, away from the transparent substrate 202, of the light guide layer 204.

Each biometric sensor 203 includes at least one thin film transistor manufactured by the method described above. For example, each biometric sensor 203 further includes a photodiode; the thin film transistor is electrically connected to the photodiode, and the thin film transistor serves as a switch to control the operation of the photodiode.

In some embodiments, the biometric device 200 is applied to a mobile phone, and a display screen of the mobile phone includes an array substrate and a front cover plate. The cover plate 205 of the biometric device 200 serves as the front cover plate of the display screen in the mobile phone, and the transparent substrate 202 serves as a base substrate (which, for example, is a glass substrate) of the array substrate of the display screen in the mobile phone. In a case where the display screen of the mobile phone is a LCD panel, the light source 201 of the biometric device 200 may serve as a backlight of the display screen of the mobile phone.

In some embodiments, in the plurality of biometric sensors 203 included in the biometric device 200, each biometric sensor 203 includes at least one thin film transistor, and a plurality of thin film transistors included in the plurality of biometric sensors 203 share a same base substrate, i.e., the transparent substrate 202 descried above.

When the user's finger(s) presses on the cover plate 205, light emitted by the light source 201 passes through the transparent substrate 202, the light guide layer 204 and the cover plate 205 to reach the finger(s), and is then reflected by the finger(s). Part of the reflected light is sensed by a plurality of biometric sensors 203. Since a distance between a valley of a fingerprint and the light source is different from a distance between a ridge of the fingerprint and the light source, the plurality of biometric sensors 203 capture the reflected light at different time points, and the light reflected by the valley and the ridge of the fingerprint are coming in at different angles. Therefore, by using the biometric sensors 203 to sense the reflected light and convert optical signals into electrical signals, it may be possible to obtain a difference between the valley and ridge of the fingerprint and thereby realize fingerprint identification. Since the thin film transistor in the biometric sensor 203 has a faster response speed, the fingerprint identification speed and sensitivity of the biometric device 200 may be improved.

In some embodiments, the biometric device 200 may be an optical fingerprint identification device, an ultrasonic fingerprint identification device, or a capacitive fingerprint identification device. In addition, the biometric device 200 may also be a device that can realize palm print identification, a device that can realize iris identification, or a device that can realize facial identification, which are not limited in the embodiments of the present disclosure.

Figure 18:
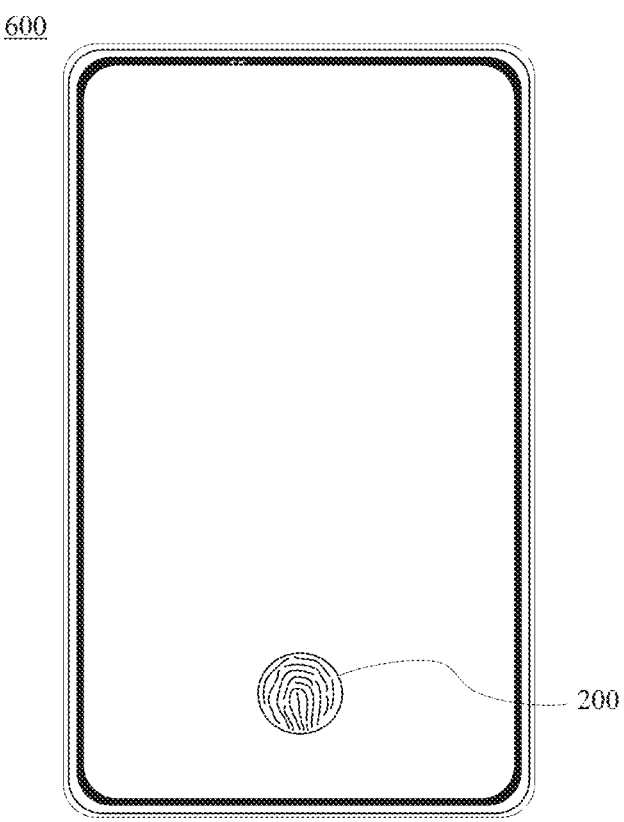
FIG. 18 is a schematic diagram of another display apparatus, in accordance with some embodiments of the present disclosure.

As shown in FIG. 18, the present disclosure further provides a display apparatus 600. The display apparatus 600 includes at least one biometric device 200 as described above.

Each of the display apparatus 500 and the display apparatus 600 provided in the embodiments of the present disclosure may be a Mini LED display apparatus, a Micro LED display apparatus, an OLED display apparatus, a LCD apparatus, a flexible display apparatuses, etc.

Each of the display apparatus 500 and the display apparatus 600 provided in the embodiments of the present disclosure may be any apparatus that displays an image whether in motion (for example, a video) or fixed (for example, a still image), and regardless of literal or graphical. More specifically, it is contemplated that the described embodiments may be implemented in or associated with a variety of electronic devices. The variety of electronic devices may include (but are not limited to), for example, mobile phones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat panel displays, computer monitors, car displays (such as odometer displays), navigators, cockpit controllers and/or displays, camera view displays (such as rear view camera displays in a vehicle), electronic photos, electronic billboards or signages, projectors, building structures, and packaging and aesthetic structures (such as a display for an image of a piece of jewelry).

In the Mini LED display apparatus, a size of a light-emitting diode (LED) is very small. If chip(s) used for driving LEDs to emit light are integrated onto a printed circuit board (PCB), a plurality of traces need to be provided in gap regions between the LEDs to ensure that all LEDs are electrically connected to the driver chip(s) through the traces. However, the provision of the plurality of traces in the gap regions between the LEDs will widen the gaps between the LEDs. Since the LEDs have a small size, the existence of the gaps will affect the display effect of the display apparatus.

On this basis, some embodiments of the present disclosure further provide a method for system integration of chip(s) and a functional device.

The chip(s) may be processing chip(s) for transmitting and processing signals, which include a monocrystalline silicon base, and complementary metal oxide semiconductor (CMOS) device(s) fabricated on the monocrystalline silicon base. The chip(s) may be configured to realize functions such as fingerprint identification. The functional device may be, for example, an array substrate in a display panel, which includes a base substrate, and driving circuits and LEDs disposed on the base substrate.

The system integration of the chip(s) and the functional device refers to a manner of arranging the chip(s) in a display area of the display panel. For example, the chip(s) are first arranged on the base substrate of the array substrate, and then the driving circuits and the LEDs are fabricated on the base substrate where the chip(s) are arranged, so as to realize system integration of the chip(s) and the functional devices.

In some embodiments, at least one chip is arranged in the display area of the display panel. For example, multiple chips may be arranged in the display area of the display panel. Each chip is electrically connected to a corresponding trace arranged in the array substrate to control several sub-pixels (for example, 9 sub-pixels or 16 sub-pixels), so as to realize the system integration.

By adopting the above structure, the chips are evenly arranged in the display area, therefore there is no need to bond corresponding function chip(s) on a side of the array substrate. Moreover, the traces in the array substrate do not need to extend to an edge of the array substrate to electrically connect to the bonded chip(s). In this way, a thickness and weight of the display apparatus may be reduced, and a wiring structure in the array substrate may be simplified.

Figure 19:
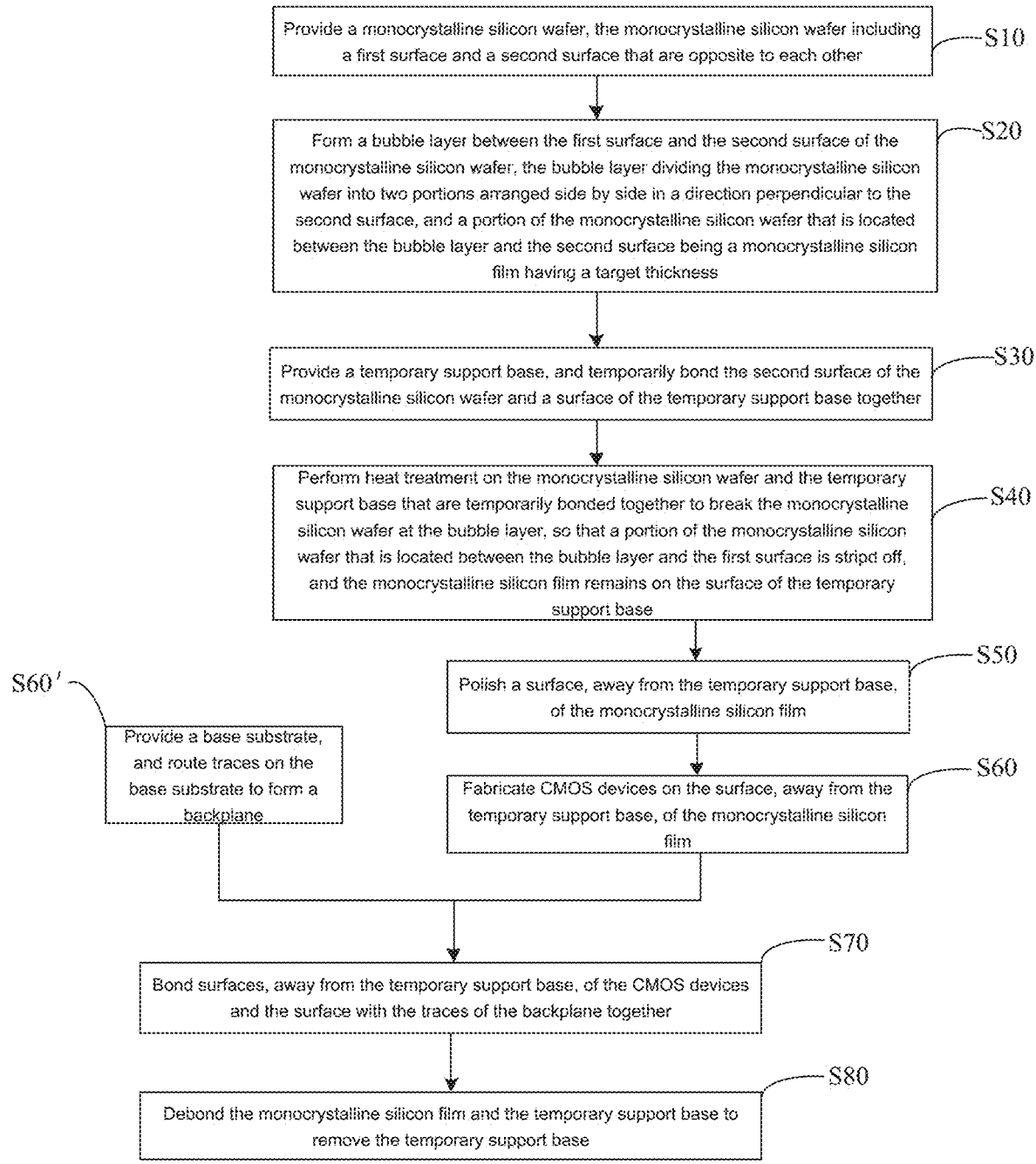
FIG. 19 is a flowchart of a method for system integration of chips and functional devices, in accordance with some embodiments of the present disclosure.

As shown in FIG. 19, some embodiments of the present disclosure further provide a method for system integration of chips and functional devices.

In some embodiments, S10-S40 in the method for system integration of the chips and the functional devices, that is, a process of manufacturing a monocrystalline silicon base of the chips, are the same as S1-S3 (that is, a process of manufacturing the monocrystalline silicon film) in the method of manufacturing the thin film transistor provided in the above embodiments of the present disclosure.

In S10, as shown in FIG. 4, a monocrystalline silicon wafer 1 is provided. The monocrystalline silicon wafer 1 includes a first surface 1A and a second surface 1B that are opposite to each other.

In S20, as shown in FIG. 5, a bubble layer A is formed between the first surface 1A and the second surface 1B of the monocrystalline silicon wafer 1. The bubble layer A divides the monocrystalline silicon wafer 1 into two portions arranged side by side in a direction Y perpendicular to the second surface 1B, and a portion of the monocrystalline silicon wafer 1 that is located between the bubble layer A and the second surface 1B is a monocrystalline silicon film 11 having a target thickness H.

In S30, as shown in FIGS. 6A to 6B, a temporary support base 2 is provided, and the second surface 1B of the monocrystalline silicon wafer 1 and a surface 2A or a surface 2B of the temporary support base 2 are temporarily bonded together. FIG. 6B illustrates a case where the second surface 1B of the monocrystalline silicon wafer 1 is temporarily bonded to the surface 2A of the temporary support base 2.

In S40, as shown in FIG. 6C, heat treatment is performed on the monocrystalline silicon wafer 1 and the temporary support base 2 that are temporarily bonded together to break the monocrystalline silicon wafer 1 at the bubble layer A, so that the monocrystalline silicon body 12 between the bubble layer A and the first surface 1A is stripped off, and the monocrystalline silicon film 11 remains on the surface 2A of the temporary support base 2. The obtained monocrystalline silicon film 11 is used as a monocrystalline silicon base of CMOS devices to be fabricated subsequently.

In above S10-S40, details of the steps are not described. As for specific description of the steps, reference may be made to S1-S2 and S31-S32 in the method of manufacturing the thin film transistor(s) in the above embodiments of the present disclosure, and details will not be repeated here.

In S50, as shown in FIG. 6C, a surface 11A, away from the temporary support base 2, of the monocrystalline silicon film 11 is polished.

Since the surface 11A of the monocrystalline silicon film 11 away from the temporary support base 2 is obtained by breaking the monocrystalline silicon wafer 1 at the bubble layer A and stripping off the monocrystalline silicon body 12, the surface 11A of the monocrystalline silicon film 11 away from the temporary support base 2 is very rough and not smooth. By polishing the surface 11A of the monocrystalline silicon film 11 away from the temporary support base 2, it may be possible to make the surface 11A of the monocrystalline silicon film 11 away from the temporary support base 2 smoother, and less rough, thereby meeting the requirement of fabricating the CMOS devices on the monocrystalline silicon film 11 in subsequent processes.

As for a method of polishing the surface 11A of the monocrystalline silicon film 11 away from the temporary support base 2, reference may be made to the description of S321 and S33' in the above embodiments, and details are not repeated here.

Figure 20:
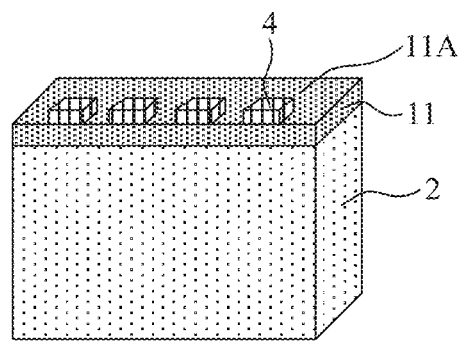
FIGS. 20 to 23 are diagrams showing steps in a method for system integration of chips and functional devices, in accordance with some embodiments of the present disclosure.

In S60, as shown in FIG. 20, CMOS devices 4 are fabricated on the surface 11A away from the temporary support base 2, of the monocrystalline silicon film 11.

Figure 21:

In S60', as shown in FIG. 21, a base substrate is provided, and traces are routed on the base substrate to form a backplane 5. One surface with the traces is a surface 5A of the backplane 5.

In the above step, in some embodiments, the base substrate is a glass substrate or a flexible substrate.

Routing the traces on the base substrate includes: forming patterned traces on the base substrate. The traces include signal lines for transmitting various electrical signals to the CMOS devices 4. For example, the traces may be metal traces. A 3D integrated processing technique may be used in routing the traces. The 3D integrated processing technique includes chemical etching, laser drilling, deep groove capacitor fabrication, via hole filling, deposition of diffusion barrier and adhesion layer, metallization, and other operations.

After the traces are routed, an insulating layer is formed on the patterned traces, and via holes are provided in the insulating layer to expose portions of the traces used to connect to the CMOS devices 4. The insulating layer may be made of an insulating resin material.

It will be noted that, in a case where the via holes are very deep, in order to ensure the electrical connection between the traces and the CMOS devices 4, the above step further includes a process of filling the via holes in the insulating layer with a conductive material (for example, a metal material with a low resistivity).

Figure 22:
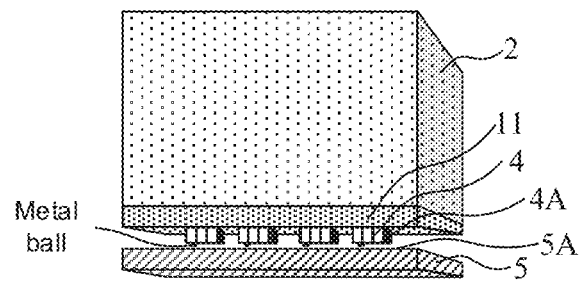

In S70, as shown in FIG. 22, surfaces 4A, away from the temporary support base 2, of the CMOS devices 4 and the surface 5A with the traces of the backplane 5 are bonded together.

For example, in the above step, metal balls (for example, tin balls or indium balls) are provided on pins of the CMOS devices 4, and a electroplating method is used to bond the CMOS devices 4 to the backplane 5, so that the metal balls are electrically connected to corresponding traces of the backplane 5 through the via holes. By adopting this method of bonding, the CMOS devices 4 and the backplane 5 may be permanently bonded together.

Figure 23:
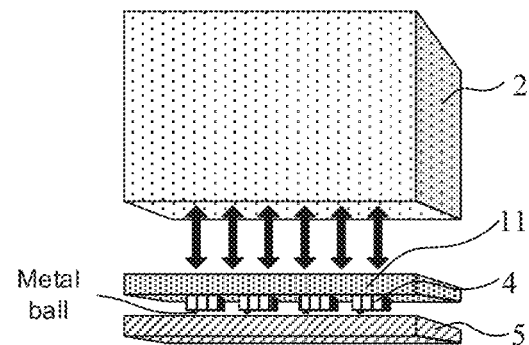
Figure 6A:
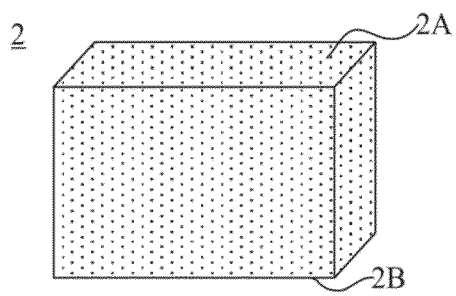
Figure 6B:
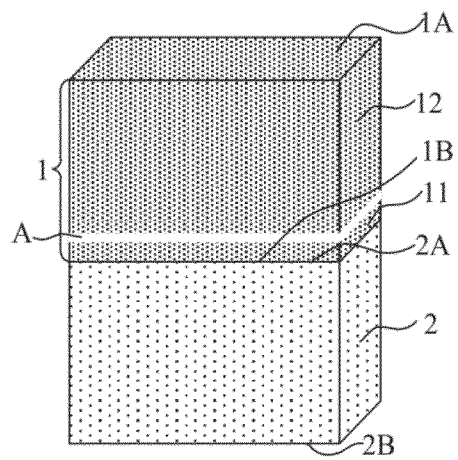
Figure 6C:
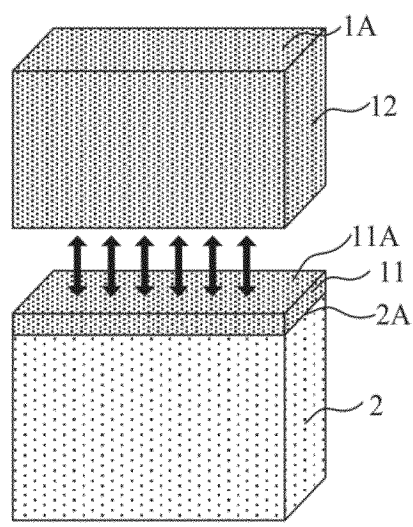
Figure 6D:
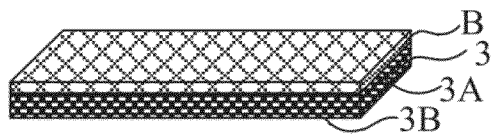
Figure 6E:
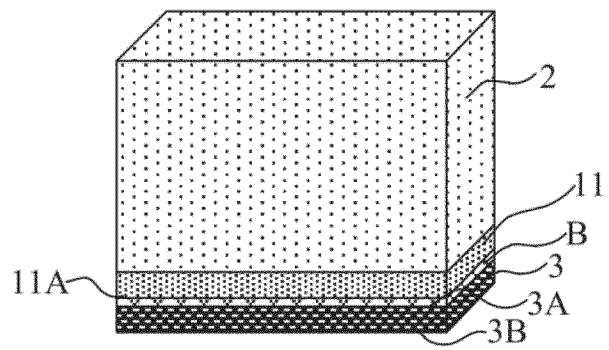
Figure 6F:
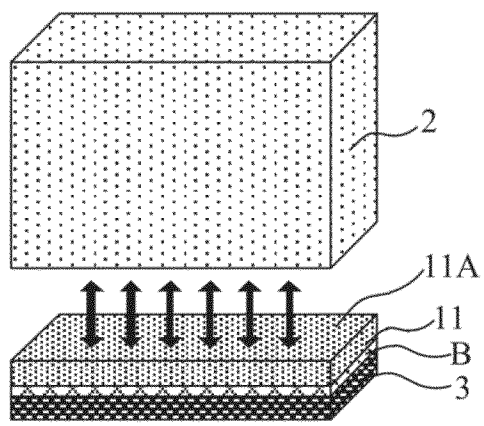
Figure 6G:
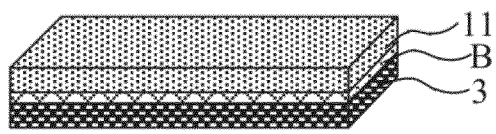
Figure 6H:
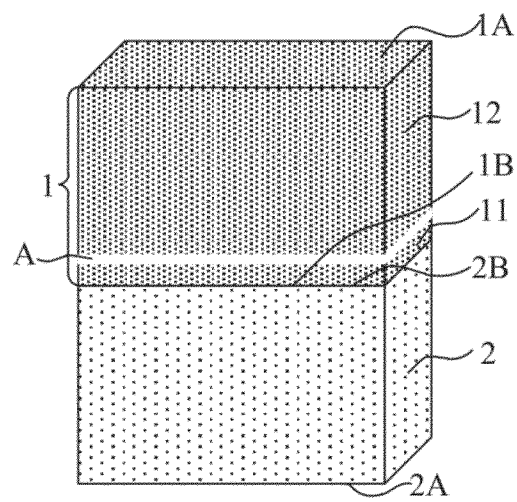
Figure 6J:
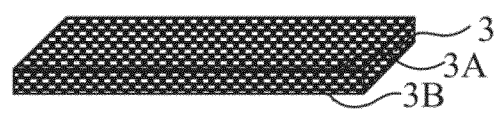
Figure 6K:
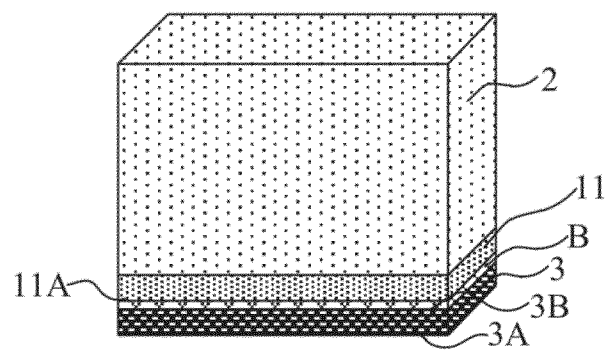

In S80, as shown in FIG. 23, the monocrystalline silicon film 11 and the temporary support base 2 are debonded to remove the temporary support base 2.

As for a manner of debonding, reference may be made to S34 in the method of manufacturing the thin film transistor(s) in the above embodiments of the present disclosure, and details will not be repeated here.

After that, driving circuits and light-emitting devices may be formed on the backplane 5.

In the method for system integration of the chips and the functional devices provided in the above embodiments, since the system integration of the chips and the functional devices is realized, there is no need to bond chips to an edge of a display apparatus. As a result, the display apparatus may be made lighter and thinner, which is conducive to realizing a narrow bezel of the display apparatus.

In addition, the method for system integration of the chips and the functional devices provided in the above embodiments may also be applied to a flexible display apparatus. In this way, flexible display apparatuses may be folded at a larger angle ranges and even smaller sizes without damaging the flexible apparatus.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:
1. A method of manufacturing at least one thin film transistor, comprising:
providing a monocrystalline silicon wafer including a first surface and a second surface that are opposite to each other;
forming a bubble layer between the first surface and the second surface of the monocrystalline silicon wafer, the bubble layer dividing the monocrystalline silicon wafer into two portions arranged side by side in a direction perpendicular to the second surface, and a portion of the monocrystalline silicon wafer that is located between the bubble layer and the second surface being a monocrystalline silicon film having a target thickness;

providing a substrate;
transferring the monocrystalline silicon film onto the substrate by breaking the monocrystalline silicon wafer at the bubble layer; and
patterning the monocrystalline silicon film transferred to the substrate to form at least one active layer of the at least one thin film transistor;
wherein before providing the substrate, the method further comprises manufacturing the substrate, including:
forming at least one gate of the at least one thin film transistor on a side of a base substrate; and
forming a gate insulating layer on a surface, away from the base substrate, of the at least one gate to obtain the substrate;
after patterning the monocrystalline silicon film transferred to the substrate to form the at least one active layer of the at least one thin film transistor, the method further comprises:
forming at least one source and at least one drain of the at least one thin film transistor on a side, away from the base substrate, of the at least one active layer.

2. The method according to claim 1, wherein providing the substrate, and transferring the monocrystalline silicon film onto the substrate by breaking the monocrystalline silicon wafer at the bubble layer, include:
providing a temporary support base;
temporarily bonding the second surface of the monocrystalline silicon wafer and a surface of the temporary support base together;
performing heat treatment on the monocrystalline silicon wafer and the temporary support base that are temporarily bonded together to break the monocrystalline silicon wafer at the bubble layer, so that a portion of the monocrystalline silicon wafer that is located between the bubble layer and the first surface is stripped off, and the monocrystalline silicon film remains on the surface of the temporary support base;
providing the substrate;
bonding a surface, away from the temporary support base, of the monocrystalline silicon film and a surface of the substrate together; and
debonding the monocrystalline silicon film and the temporary support base to remove the temporary support base.

3. The method according to claim 2, wherein before bonding the surface, away from the temporary support base, of the monocrystalline silicon film and the surface of the substrate together, the method further comprises:
polishing the surface, away from the temporary support base, of the monocrystalline silicon film.

4. The method according to claim 2, wherein before bonding the surface, away from the temporary support base, of the monocrystalline silicon film and the surface of the substrate together, the method further comprises:
forming a first bonding adhesive layer on the surface, to be bonded with the monocrystalline silicon film, of the provided substrate; and/or
forming a first bonding adhesive layer on the surface, away from the temporary support base, of the monocrystalline silicon film.

5. The method according to claim 1, wherein providing the substrate, and transferring the monocrystalline silicon film onto the substrate by breaking the monocrystalline silicon wafer at the bubble layer, include:
providing the substrate;
bonding the second surface of the monocrystalline silicon wafer and a surface of the substrate together;
performing heat treatment on the monocrystalline silicon wafer and the substrate that are bonded together to break the monocrystalline silicon wafer at the bubble layer, so that a portion of the monocrystalline silicon wafer that is located between the bubble layer and the first surface is stripped off, and the monocrystalline silicon film remains on the surface of the substrate.

6. The method according to claim 5, further comprising:
polishing a surface, away from the substrate, of the monocrystalline silicon film remaining on the surface of the substrate.

7. The method according to claim 5, wherein before bonding the second surface of the monocrystalline silicon wafer and the surface of the substrate together, the method further comprises:
forming a second bonding adhesive layer on the surface, to be bonded with the monocrystalline silicon wafer, of the provided substrate; and/or
forming a second bonding adhesive layer on the second surface of the monocrystalline silicon wafer.

8. The method according to claim 2, wherein before temporarily bonding the second surface of the monocrystalline silicon wafer and the surface of the temporary support base together, the method further comprises:
polishing the second surface of the monocrystalline silicon wafer.

9. The method according to claim 1, wherein forming the bubble layer between the first surface and the second surface of the monocrystalline silicon wafer, includes:
implanting gas ions into the monocrystalline silicon wafer from the first surface or the second surface of the monocrystalline silicon wafer by using an ion implantation process, wherein a depth of ion implantation is controlled to form the bubble layer at a pre-determined position between the first surface and the second surface of the monocrystalline silicon wafer, and a distance between the pre-determined position and the second surface is the target thickness.

10. The method according to claim 1, wherein the base substrate is a glass substrate or a flexible substrate.

11. The method according to claim 1, wherein a thickness of the active layer is 1 µm to 10 µm.

12. A method of manufacturing an array substrate, comprising: forming a structure including a base substrate and a plurality of thin film transistors on the base substrate by the method according to claim 1, the at least one thin film transistor including the plurality of thin film transistors.

13. A method of manufacturing a display apparatus, comprising: forming the array substrate by the method according to claim 12.

14. A method of manufacturing a biometric device, the biometric device including a base substrate and at least one biometric sensor on the base substrate, and each biometric sensor including at least one thin film transistor, the method comprising: forming a structure including the base substrate and at least one thin film transistor included in the at least one biometric sensor by the method according to claim 1.

15. A method of manufacturing a display apparatus including at least one biometric device, the method comprising:
forming a biometric device by the method according to claim 14.

16. The method according to claim 5, wherein before bonding the second surface of the monocrystalline silicon wafer and the surface of the substrate together, the method further comprises:

polishing the second surface of the monocrystalline silicon wafer.

17. A method of manufacturing at least one thin film transistor, comprising:
providing a monocrystalline silicon wafer including a first surface and a second surface that are opposite to each other;
forming a bubble layer between the first surface and the second surface of the monocrystalline silicon wafer, the bubble layer dividing the monocrystalline silicon wafer into two portions arranged side by side in a direction perpendicular to the second surface, and a portion of the monocrystalline silicon wafer that is located between the bubble layer and the second surface being a monocrystalline silicon film having a target thickness;
providing a substrate;
transferring the monocrystalline silicon film onto the substrate by breaking the monocrystalline silicon wafer at the bubble layer; and
patterning the monocrystalline silicon film transferred to the substrate to form at least one active layer of the at least one thin film transistor;
wherein before providing the substrate, the method further comprises manufacturing the substrate, including:
forming a barrier layer on a side of a base substrate to obtain the substrate;
after patterning the monocrystalline silicon film transferred to the substrate to form the at least one active layer of the at least one thin film transistor, the method further comprises:
sequentially forming a gate insulating layer, at least one gate of the at least one thin film transistor, an interlayer dielectric layer, and at least one source and at least one drain of the at least one thin film transistor on a side, away from the base substrate, of the at least one active layer.

* * * * *

UNITED STATES PATENT AND TRADEMARK OFFICE
CERTIFICATE OF CORRECTION

PATENT NO. : 11,830,763 B2
APPLICATION NO. : 17/278855
DATED : November 28, 2023
INVENTOR(S) : Shan Zhang et al.

It is certified that error appears in the above-identified patent and that said Letters Patent is hereby corrected as shown below:

On the Title Page

Delete the title page and substitute therefore with the attached title page.

In the Drawings

Please replace Figs. 6A, 6B, 6C, 6D, 6E, 6F, 6G, 6H, 6J, 6K and 6L with 6A, 6B, 6C, 6D, 6E, 6F, 6G, 6H, 6J, 6K as shown on the attached pages.

Signed and Sealed this
Nineteenth Day of March, 2024

Katherine Kelly Vidal
Director of the United States Patent and Trademark Office

(12) United States Patent
Zhang et al.

(10) Patent No.: US 11,830,763 B2
(45) Date of Patent: Nov. 28, 2023

(54) METHODS OF MANUFACTURING THIN FILM TRANSISTOR, BIOMETRIC DEVICE, AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Shan Zhang, Beijing (CN); Lianjie Qu, Beijing (CN); Yonglian Qi, Beijing (CN); Hebin Zhao, Beijing (CN)

(73) Assignees: BEIJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 263 days.

(21) Appl. No.: 17/278,855

(22) PCT Filed: Jul. 24, 2020

(86) PCT No.: PCT/CN2020/104464
§ 371 (c)(1),
(2) Date: Mar. 23, 2021

(87) PCT Pub. No.: WO2021/018037
PCT Pub. Date: Feb. 4, 2021

(65) Prior Publication Data
US 2022/0037198 A1    Feb. 3, 2022

(30) Foreign Application Priority Data
Jul. 26, 2019  (CN) .................... 201910684062.1

(51) Int. Cl.
*H01L 21/765*  (2006.01)
*H01L 21/762*  (2006.01)
(Continued)

(52) U.S. Cl.
CPC .... *H01L 21/76254* (2013.01); *H01L 21/6835* (2013.01); *H01L 27/127* (2013.01);
(Continued)

(58) Field of Classification Search
CPC .......... H01L 21/76254; H01L 21/6835; H01L 27/127; H01L 29/66772; H01L 29/78654;
(Continued)

(56) References Cited

U.S. PATENT DOCUMENTS 6,146,979 A * 11/2000 Henley .............. H01L 21/2658
                                                     438/455
6,762,470 B2 * 7/2004 Siegel ............... G06V 40/1329
                                                     257/414
(Continued)

FOREIGN PATENT DOCUMENTS

CN    108232169S    6/2018
CN    109786392     5/2019
(Continued)

OTHER PUBLICATIONS

PCT International Search Report (w/ English translation) for corresponding PCT Application No. PCT/CN2020/104464, dated Oct. 10, 2020, 6 pages.
(Continued)

*Primary Examiner* — Vu A Vu
(74) *Attorney, Agent, or Firm* — Dority & Manning, P.A.

(57) ABSTRACT

A method of manufacturing thin film transistor(s) includes: providing a monocrystalline silicon wafer, the monocrystalline silicon wafer including a first surface and a second surface that are opposite to each other; forming a bubble layer between the first surface and the second surface of the monocrystalline silicon wafer, the bubble layer dividing the monocrystalline silicon wafer into two portions arranged side by side in a direction perpendicular to the second
(Continued)

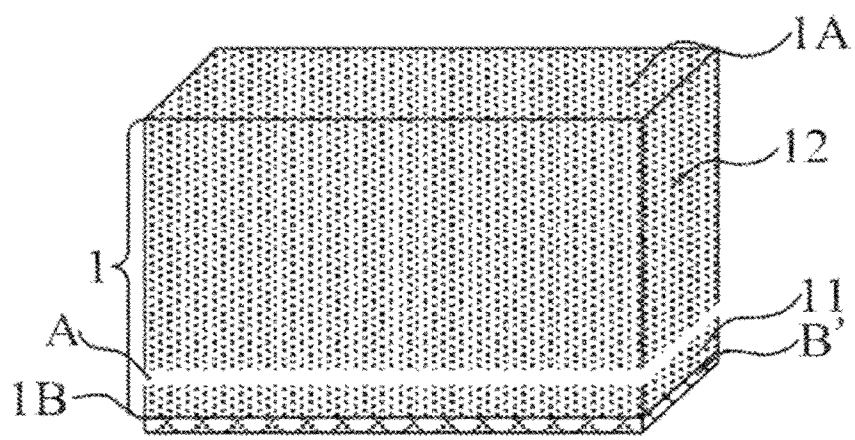

surface, and a portion of the monocrystalline silicon wafer that is located between the bubble layer and the second surface being a monocrystalline silicon film having a target thickness; providing a substrate, and transferring the monocrystalline silicon film onto the substrate by breaking the monocrystalline silicon wafer at the bubble layer; and patterning the monocrystalline silicon film transferred to the substrate to form active layer(s) of the thin film transistor(s).

17 Claims, 15 Drawing Sheets

(51) Int. Cl.
H01L 21/683 (2006.01)
H01L 27/12 (2006.01)
H01L 29/66 (2006.01)
H01L 29/786 (2006.01)
G06V 40/13 (2022.01)

(52) U.S. Cl.
CPC .. *H01L 29/66772* (2013.01); *H01L 29/78654* (2013.01); *G06V 40/1318* (2022.01); *H01L 2221/68368* (2013.01)

(58) Field of Classification Search
CPC ....... H01L 2221/68368; H01L 27/1203; H01L 27/1266; H01L 2221/6835; H01L 2221/68381; H01L 21/02532; H01L 21/02598; H01L 27/1214; H01L 29/66742; H01L 29/6675; G06V 40/1318
USPC .................................................. 438/162
See application file for complete search history.

(56) References Cited

U.S. PATENT DOCUMENTS

| | | | | |
|---|---|---|---|---|
| 7,508,034 B2* | 3/2009 | Takafuji | H01L 29/78603 | 257/66 |
| 7,763,502 B2* | 7/2010 | Kakehata | H01L 21/76254 | 438/455 |
| 7,839,001 B2* | 11/2010 | Boussagol | H01L 21/2007 | 438/455 |
| 8,101,999 B2* | 1/2012 | Takizawa | H01L 21/2658 | 438/70 |
| 8,143,140 B2* | 3/2012 | Kasai | H01L 21/76251 | 257/E21.568 |
| 8,222,117 B2* | 7/2012 | Yamazaki | H01L 21/76254 | 257/507 |
| 8,476,146 B2* | 7/2013 | Chen | H01L 21/76254 | 438/455 |
| 8,637,383 B2* | 1/2014 | Werkhoven | H01L 29/2003 | 438/458 |
| 8,877,607 B2* | 11/2014 | Koezuka | H01L 21/76254 | 257/E21.568 |
| 9,136,141 B2* | 9/2015 | Koezuka | H01L 21/76254 | |
| 9,793,154 B2* | 10/2017 | Aga | H01L 21/022 | |
| 2006/0040469 A1 | 2/2006 | Aga et al. | | |
| 2008/0280416 A1 | 11/2008 | Bedell et al. | | |
| 2010/0096720 A1 | 4/2010 | Ohmuna et al. | | |
| 2010/0291752 A1 | 11/2010 | Okuno | | |
| 2013/0092320 A1 | 4/2013 | Argoud et al. | | |
| 2018/0175283 A1 | 6/2018 | Akiyama et al. | | |

FOREIGN PATENT DOCUMENTS

| | | |
|---|---|---|
| CN | 110349843 | 10/2019 |
| JP | 5286684 | 9/2013 |
| WO | WO2011131847 | 10/2011 |

OTHER PUBLICATIONS

Chinese First Office Action (w/ English translation) for corresponding CN Application No. 201910684062.1, 22 pages.
Chinese Second Office Action (w/ English translation) for corresponding CN Application No. 201910684062.1, 17 pages.

* cited by examiner